United States Patent
Fazan et al.

(10) Patent No.: US 6,873,539 B1
(45) Date of Patent: Mar. 29, 2005

(54) SEMICONDUCTOR DEVICE

(76) Inventors: Pierre Fazan, Avenue du Carroz 1, 1110 Morges (CH); Serguei Okhonin, Avenue Jolimont 2, 1005 Lausanne (CH)

(*) Notice: Subject to any disclaimer, the term of this patent is extended or adjusted under 35 U.S.C. 154(b) by 96 days.

(21) Appl. No.: 10/727,742

(22) Filed: Dec. 4, 2003

Related U.S. Application Data

(62) Division of application No. 10/450,238, filed as application No. PCT/EP02/06495 on Jun. 5, 2002.

(30) Foreign Application Priority Data

| Jun. 18, 2001 | (EP) | ............................................ 01810587 |
| Mar. 28, 2002 | (EP) | ............................................ 02405247 |
| Apr. 18, 2002 | (EP) | ............................................ 02405315 |

(51) Int. Cl.[7] ............................................. G11C 11/24
(52) U.S. Cl. ........................ 365/149; 365/182; 365/184
(58) Field of Search ................................. 257/296, 304, 257/347, 314, 402, 405; 365/149, 150, 182, 184

(56) References Cited

U.S. PATENT DOCUMENTS

| 3,439,214 A | 4/1969 | Kabell ........................ 315/11 |
| 3,997,799 A | 12/1976 | Baker ........................... 365/183 |
| 4,032,947 A | 6/1977 | Kesel et al. ................. 257/214 |
| 4,298,962 A | * 11/1981 | Hamano et al. ............ 365/182 |
| 4,791,610 A | 12/1988 | Takemae |
| 4,979,014 A | 12/1990 | Hieda et al. |
| 5,144,390 A | 9/1992 | Matloubian ................. 257/347 |
| 5,164,805 A | * 11/1992 | Lee ............................ 257/351 |
| 5,258,635 A | 11/1993 | Nitayama et al. |
| 5,388,068 A | 2/1995 | Ghoshal et al. |
| 5,446,299 A | 8/1995 | Acovic et al. |
| 5,448,513 A | 9/1995 | Hu et al. .................... 365/150 |

(Continued)

FOREIGN PATENT DOCUMENTS

| EP | 0 030 856 | 6/1981 |
| EP | 0 350 057 B1 | 1/1990 |
| EP | 0 354 348 A2 | 2/1990 |
| EP | 0 362 961 A1 | 4/1990 |
| EP | 0 202 515 B1 | 3/1991 |
| EP | 0 207 619 B1 | 8/1991 |
| EP | 0 175 378 B1 | 11/1991 |
| EP | 0 253 631 B1 | 4/1992 |
| EP | 0 513 923 | 11/1992 |

(Continued)

OTHER PUBLICATIONS

"A Capacitorless Double–Gate DRAM Cell", Kuo et al., IEEE Electron Device Letters, vol. 23, No. 6, Jun. 2002, pp. 345–347.

"A Capacitorless Double–Gate DRAM Cell for High Density Applications", Kuo et al., IEEE IEDM, 2002, pp. 643–946.

(Continued)

*Primary Examiner*—Son Mai
(74) *Attorney, Agent, or Firm*—Neil A. Steinberg

(57) ABSTRACT

A semiconductor device, such as a memory device or radiation detector, is disclosed, in which data storage cells are formed on a substrate. Each of the data storage cells includes a field effect transistor having a source, drain, and gate, and a body arranged between the source and drain for storing electrical charge generated in the body. The magnitude of the net electrical charge in the body can be adjusted by input signals applied to the transistor, and the adjustment of the net electrical charge by the input signals can be at least partially cancelled by applying electrical voltage signals between the gate and the drain and between the source and the drain.

33 Claims, 20 Drawing Sheets

U.S. PATENT DOCUMENTS

| | | | |
|---|---|---|---|
| 5,466,625 A | 11/1995 | Hsieh et al. | |
| 5,489,792 A | 2/1996 | Hu et al. | 257/347 |
| 5,528,062 A | 6/1996 | Hsieh et al. | |
| 5,568,356 A | 10/1996 | Schwartz | |
| 5,593,912 A | 1/1997 | Rajeevakumar | |
| 5,606,188 A | 2/1997 | Bronner et al. | |
| 5,608,250 A * | 3/1997 | Kalnitsky | 257/314 |
| 5,627,092 A | 5/1997 | Alsmeier et al. | |
| 5,631,186 A | 5/1997 | Park et al. | |
| 5,696,718 A | 12/1997 | Hartmann | 365/185.27 |
| 5,740,099 A | 4/1998 | Tanigawa | |
| 5,778,243 A | 7/1998 | Aipperspach et al. | |
| 5,780,906 A | 7/1998 | Wu et al. | 257/368 |
| 5,784,311 A | 7/1998 | Assaderaghi et al. | |
| 5,811,283 A | 9/1998 | Sun | |
| 5,877,978 A | 3/1999 | Morishita et al. | |
| 5,886,376 A | 3/1999 | Acovic et al. | |
| 5,886,385 A | 3/1999 | Arisumi et al. | |
| 5,897,351 A | 4/1999 | Forbes | |
| 5,929,479 A | 7/1999 | Oyama | |
| 5,930,648 A | 7/1999 | Yang | |
| 5,936,265 A | 8/1999 | Koga | 257/105 |
| 5,939,745 A | 8/1999 | Park et al. | |
| 5,943,258 A | 8/1999 | Houston et al. | |
| 5,943,581 A | 8/1999 | Lu et al. | |
| 5,960,265 A | 9/1999 | Acovic et al. | |
| 5,968,840 A | 10/1999 | Park et al. | |
| 5,977,578 A | 11/1999 | Tang | |
| 5,982,003 A | 11/1999 | Hu et al. | 257/347 |
| 6,018,172 A | 1/2000 | Hidada et al. | |
| 6,081,443 A | 6/2000 | Morishita et al. | 365/149 |
| 6,096,598 A | 8/2000 | Furukawa et al. | |
| 6,097,056 A | 8/2000 | Hsu et al. | |
| 6,111,778 A | 8/2000 | MacDonald et al. | 365/149 |
| 6,121,077 A | 9/2000 | Hu et al. | |
| 6,157,216 A | 12/2000 | Lattimore et al. | |
| 6,171,923 B1 | 1/2001 | Chi et al. | |
| 6,177,300 B1 | 1/2001 | Houston et al. | |
| 6,177,708 B1 | 1/2001 | Kuang et al. | |
| 6,214,694 B1 | 4/2001 | Leobandung et al. | |
| 6,225,158 B1 | 5/2001 | Furukawa et al. | |
| 6,245,613 B1 | 6/2001 | Hsu et al. | |
| 6,252,281 B1 | 6/2001 | Yamamoto et al. | |
| 6,292,424 B1 | 9/2001 | Ohsawa | |
| 6,297,090 B1 | 10/2001 | Kim | |
| 6,300,649 B1 | 10/2001 | Hu et al. | 257/69 |
| 6,320,227 B1 | 11/2001 | Lee et al. | |
| 6,333,532 B1 | 12/2001 | Davari et al. | |
| 6,350,653 B1 | 2/2002 | Adkisson et al. | |
| 6,351,426 B1 | 2/2002 | Ohsawa | |
| 6,384,445 B1 | 5/2002 | Hidaka et al. | |
| 6,391,658 B1 | 5/2002 | Gates et al. | |
| 6,403,435 B1 | 6/2002 | Kang et al. | |
| 6,424,011 B1 | 7/2002 | Assaderaghi et al. | |
| 6,424,016 B1 | 7/2002 | Houston | |
| 6,429,477 B1 | 8/2002 | Mandelman et al. | |
| 6,440,872 B1 | 8/2002 | Mandelman et al. | |
| 6,441,435 B1 | 8/2002 | Chan | |
| 6,441,436 B1 | 8/2002 | Wu et al. | |
| 6,466,511 B2 | 10/2002 | Fujita et al. | |
| 6,479,862 B1 * | 11/2002 | King et al. | 257/321 |
| 6,492,211 B1 | 12/2002 | Divakaruni et al. | |
| 6,518,105 B1 | 2/2003 | Yang et al. | 438/151 |
| 6,531,754 B1 | 3/2003 | Nagano et al. | |
| 6,538,916 B2 | 3/2003 | Ohsawa | |
| 6,544,837 B1 | 4/2003 | Divakaruni et al. | |
| 6,548,848 B2 | 4/2003 | Horiguchi et al. | |
| 6,549,450 B1 | 4/2003 | Hsu et al. | |
| 6,552,398 B2 | 4/2003 | Hsu et al. | |
| 6,556,477 B2 | 4/2003 | Hsu et al. | |
| 6,566,177 B1 | 5/2003 | Radens et al. | |
| 6,567,330 B2 | 5/2003 | Fujita et al. | |
| 6,590,258 B2 | 7/2003 | Divakauni et al. | |
| 6,590,259 B2 | 7/2003 | Adkisson et al. | |
| 6,617,651 B2 | 9/2003 | Ohsawa | |
| 6,621,725 B2 | 9/2003 | Ohsawa | |
| 6,632,723 B2 | 10/2003 | Watanabe et al. | |
| 6,650,565 B1 | 11/2003 | Ohsawa | |
| 6,714,436 B1 * | 3/2004 | Burnett et al. | 365/149 |
| 2001/0055859 A1 | 12/2001 | Yamada et al. | |
| 2002/0030214 A1 | 3/2002 | Horiguchi | |
| 2002/0034855 A1 | 3/2002 | Horiguchi et al. | |
| 2002/0036322 A1 | 3/2002 | Divakauni et al. | |
| 2002/0051378 A1 | 5/2002 | Ohsawa | |
| 2002/0064913 A1 | 5/2002 | Adkisson et al. | |
| 2002/0070411 A1 | 6/2002 | Vermandel et al. | |
| 2002/0072155 A1 | 6/2002 | Liu et al. | |
| 2002/0076880 A1 | 6/2002 | Yamada et al. | |
| 2002/0086463 A1 | 7/2002 | Houston et al. | |
| 2002/0089038 A1 | 7/2002 | Ning | |
| 2002/0098643 A1 | 7/2002 | Kawanaka et al. | |
| 2002/0110018 A1 | 8/2002 | Ohsawa | |
| 2002/0114191 A1 | 8/2002 | Iwata et al. | |
| 2002/0130341 A1 | 9/2002 | Horiguchi et al. | |
| 2002/0160581 A1 | 10/2002 | Watanabe et al. | |
| 2002/0180069 A1 | 12/2002 | Houston | |
| 2003/0003608 A1 | 1/2003 | Arikado et al. | |
| 2003/0015757 A1 | 1/2003 | Ohsawa | |
| 2003/0035324 A1 | 2/2003 | Fujita et al. | |
| 2003/0057487 A1 | 3/2003 | Yamada et al. | |
| 2003/0057490 A1 | 3/2003 | Nagano et al. | |
| 2003/0102497 A1 | 6/2003 | Fried et al. | |
| 2003/0112659 A1 | 6/2003 | Ohsawa | |
| 2003/0123279 A1 | 7/2003 | Aipperspach et al. | |
| 2003/0146488 A1 | 8/2003 | Nagano et al. | |
| 2003/0151112 A1 | 8/2003 | Yamada et al. | |

FOREIGN PATENT DOCUMENTS

| | | |
|---|---|---|
| EP | 0 300 157 B1 | 5/1993 |
| EP | 0 564 204 A2 | 10/1993 |
| EP | 0 579 566 A2 | 1/1994 |
| EP | 0 362 961 B1 | 2/1994 |
| EP | 0 599 506 A1 | 6/1994 |
| EP | 0 359 551 B1 | 12/1994 |
| EP | 0 642 173 A1 | 3/1995 |
| EP | 0 366 882 B1 | 5/1995 |
| EP | 0 465 961 B1 | 8/1995 |
| EP | 0 694 977 | 1/1996 |
| EP | 0 333 426 B1 | 7/1996 |
| EP | 0 727 820 A1 | 8/1996 |
| EP | 0 739 097 A2 | 10/1996 |
| EP | 0 245 515 B1 | 4/1997 |
| EP | 0 788 165 A2 | 8/1997 |
| EP | 0 801 427 | 10/1997 |
| EP | 0 510 607 B1 | 2/1998 |
| EP | 0 537 677 B1 | 8/1998 |
| EP | 0 858 109 A2 | 8/1998 |
| EP | 0 860 878 A2 | 8/1998 |
| EP | 0 869 511 A2 | 10/1998 |
| EP | 0 878 804 | 11/1998 |
| EP | 0 920 059 A2 | 6/1999 |
| EP | 0 924 766 A2 | 6/1999 |
| EP | 0 642 173 B1 | 7/1999 |
| EP | 0 727 822 B1 | 8/1999 |
| EP | 0 933 820 A1 | 8/1999 |
| EP | 0 951 072 A1 | 10/1999 |
| EP | 0 971 360 A1 | 1/2000 |
| EP | 0 980 101 A2 | 2/2000 |
| EP | 0 601 590 B1 | 4/2000 |
| EP | 0 993 037 A2 | 4/2000 |
| EP | 0 836 194 B1 | 5/2000 |

| | | |
|---|---|---|
| EP | 0 599 388 B1 | 8/2000 |
| EP | 0 689 252 B1 | 8/2000 |
| EP | 0 606 758 B1 | 9/2000 |
| EP | 0 682 370 B1 | 9/2000 |
| EP | 1 073 121 A2 | 1/2001 |
| EP | 0 726 601 B1 | 9/2001 |
| EP | 0 731 972 | 11/2001 |
| EP | 0 731 972 B1 | 11/2001 |
| EP | 1 162 663 A2 | 12/2001 |
| EP | 1 162 744 A1 | 12/2001 |
| EP | 1 179 850 A2 | 2/2002 |
| EP | 1 180 799 | 2/2002 |
| EP | 1 191 596 | 3/2002 |
| EP | 1 204 146 A1 | 5/2002 |
| EP | 1 204 147 A1 | 5/2002 |
| EP | 1 209 747 A2 | 5/2002 |
| EP | 0 744 772 B1 | 8/2002 |
| EP | 1 233 454 | 8/2002 |
| EP | 0 725 402 B1 | 9/2002 |
| EP | 1 237 193 | 9/2002 |
| EP | 1 241 708 A2 | 9/2002 |
| EP | 1 253 634 A2 | 10/2002 |
| EP | 0 844 671 B1 | 11/2002 |
| EP | 1 280 205 A2 | 1/2003 |
| EP | 1 288 955 A2 | 3/2003 |
| FR | 2 197 494 | 3/1974 |
| GB | 1 414 228 | 11/1975 |
| JP | 62 272561 | 11/1987 |
| JP | 02 294076 | 2/1991 |
| JP | 3-171768 | 7/1991 |
| JP | 8-213624 | 8/1996 |
| JP | 8 274277 | 10/1996 |
| JP | 09046688 | 2/1997 |
| JP | 9 82912 | 3/1997 |
| JP | 11 87649 | 3/1999 |
| JP | 247735 | 8/2000 |
| JP | 274221 | 9/2000 |
| JP | 389106 | 12/2000 |
| JP | 180633 | 6/2001 |
| JP | 2002-94027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-31693 | 1/2003 |
| JP | 2003-86712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |

OTHER PUBLICATIONS

"The Multi–Stable Behaviour of SOI–NMOS Transistors at Low Temperatures", Track et al., Proc. 1988 SOS/SOI Technology Workshop (See Palms Resort, St. Simons Island, GA, Oct. 1988), p. 78.

"The Multistable Charge–Controlled Memory Effect in SOI MOS Transistors at Low Temperatures", Tack et al., IEEE Transactions on Electron Devices, vol. 37, No. 5, May 1990, pp. 1373–1382.

"Mechanisums of Charge Modulation in the Floating Body of Triple–Well nMOSFET Capacitor–less DRAMs", Villaret et al., Proceedings of the INFOS 2003, Barcelona (Spain), (4 pages).

"A Memory Using One–Transistor Gain Cell on SOI (FBC) with Performance Suitable for Embedded DRAM's", Ohsawa et al., 2003 Symposium on VLSI Circuits Digest of Technical Papers, Jun. 2003 (4 pages).

"FBC (Floating Body Cell) for Embedded DRAM on SOI, Inoh et al., 2003 Symposium on VLSI Circuits Digest of Technical Papers, Jun. 2003 (2 pages).

"Toshiba's DRAM Cell Piggybacks on SOI Wafer", Y. Hara, EE Times, Jun. 2003.

"Memory Design Using a One–Transistor Gain Cell on SOI", Ohsawa et al., IEEE Journal of Solid–State Circuits, vol. 37, No. 11, Nov. 2002, pp. 1510–1522.

"Opposite Side Floating Gate SOI FLASH Memory Cell", Lin et al., IEEE, Mar. 2000, pp. 12–15.

"Advanced TFT SRAM Cell Technology Using a Phase–Shift Lithography", Yamanaka et al., IEEE Transactions on Electron Devices, vol. 42, No. 7, July 1995, pp. 1305–1313.

"Soft–Error Characteristics in Bipolar Memory Cells with Small Critical Charge", Idei et al., IEEE Transactions on Electron Devices, vol. 38, No. 11, Nov. 1991, pp. 2465–2471.

"An SOI 4 Transistors Self–Refresh Ultra–Low–Voltage Memory Cell", Thomas et al., IEEE, Mar. 2003, pp. 401–404.

"Design of a SOI Memory Cell", Stanojevic et al., IEEE Proc. 21$^{st}$ International Conference Microelectronics (MIEL '97), vol. 1, NIS, Yugoslavis, Sep. 14–17, 1997, pp. 297–300.

"Effect of Floating Body on Double Polysilicon Partially Depleted SOI Nonvolatile Memory Cell", Chan et al., IEEE Electron Device Letters, vol. 24, No. 2, Feb. 2003, pp. 75–77.

"MOSFET Design Simplifies DRAM", P. Fazan, EE Times, May 14, 2002 (3 pages).

"One of Application of SOI Memory Cell—Memory Array", Lončar et al., IEEE Proc. 22$^{nd}$ International Conference on Microelectronics (MIEL 2000), vol. 2, NIŠ, Serbia, May 14–17, 2000, pp. 455–458.

"A SOI Current Memory for Analog Signal Processing at High Temperature", Portmann et al., 1999 IEEE International SOI Conference, Oct. 1999, pp. 18–19.

"Chip Level Reliability on SOI Embedded Memory", Kim et al., Proceedings 1998 IEEE International SOI Conference, Oct. 1998, pp. 135–139.

"Analysis of Floating–Body–Induced Leakage Current in 0.15$\mu$m SOI DRAM", Terauchi et al., Proceedings 1996 IEEE International SOI Conference, Oct. 1996, pp. 138–139.

"Programmimg and Erase with Floating–Body for High Density Low Voltage Flash EEPROM Fabricated on SOI Wafers", Chi et al., Proceedings 1995 IEEE International SOI Conference, Oct. 1995, pp. 129–130.

"Measurement of Transient Effects in SOI DRAM/SRAM Access Transistors", A. Wei, IEEE Electron Device Letters, vol. 17, No. 5, May 1996, pp. 193–195.

"In–Depth Analysis of Opposite Channel Based Charge Injection in SOI MOSFETs and Related Defect Creation and Annihilation", Sinha et al., Elsevier Science, Microelectronic Engineering 28, 1995, pp. 383–386.

"Dynamic Effects in SOI MOSFET's", Giffard et al., IEEE, 1991, pp. 160–161.

"A Simple 1–Transistor Capacitor–Less Memory Cell for High Performance Embedded DRAMs", Fazan et al., IEEE 2002 Custom Integrated Circuits Conference, Jun. 2002, pp. 99–102.

"A Novel Pattern Transfer Process for Bonded SOI Giga–bit DRAMs", Lee et al., Proceedings 1996 IEEE International SOI Conference, Oct. 1996, pp. 114–115.

"An Experimental 2–bit/Cell Storage DRAM for Macrocell or Memory–on–Logic Application", Furuyama et al., IEEE Journal of Solid–State Circuits, vol. 24, No. 2, Apr. 1989, pp. 388–393.

"High–Performance Embedded SOI DRAM Architecture for the Low–Power Supply", Yamauchi et al., IEEE Journal of Solid–State Circuits, vol. 35, No. 8, Aug. 2000, pp. 1169–1178.

"An SOI–DRAM with Wide Operating Voltage Range by CMOS/SIMOX Technology", Suma et al., 1994 IEEE International Solid–State Circuits Conference, pp. 138–139.

"A Capacitorless DRAM Cell on SOI Substrate", Wann et al., IEEE IEDM, 1993, pp. 635–638.

"The Multistable Charge Controlled Memory Effect in SOI Transistors at Low Temperatures", Tack et al., IEEE Workshop on Low Temperature Electronics, Aug. 7–8, 1989, University of Vermont, Burlington, pp. 137–141.

"High–Endurance Ultra–Thin Tunnel Oxide in MONOS Device Structure for Dynamic Memory Application", Wann et al., IEEE Electron Device Letters, vol. 16, No. 11, Nov. 1995, pp. 491–493.

"Hot–Carrier Effects in Thin–Film Fully Depleted SOI MOSFET's", Ma et al., IEEE Electron Device Letters, vol. 15, No. 6, Jun. 1994, pp. 218–220.

"Design Analysis of Thin–Body Silicide Source/Drain Devices", 2001 IEEE International SOI Conference, Oct. 2001, pp. 21–22.

"SOI MOSFET on Low Cost SPIMOX Substrate", Iyer et al., IEEE IEDM, Sep. 1998, pp. 1001–1004.

"Simulation of Floating Body Effect in SOI Circuits Using BSIM3SOI", Tu et al., Proceedings of Technical Papers (IEEE Cat No. 97$^{TH}$8303), pp. 339–342.

"High–Field Transport of Inversion–Layer Electrons and Holes Including Velocity Overshoot", Assaderaghi et al., IEEE Transactions on Electron Devices, vol. 44, No. 4, Apr. 1997, pp. 664–671.

"Dynamic Threshold–Voltage MOSFET (DTMOS) for Ultra–Low Voltage VLSI", Assaderaghi et al., IEEE Transactions on Electron Devices, vol. 44, No. 3, Mar. 1997, pp. 414–422.

"Hot–Carrier–Induced Degration in Ultra–Thin–Film Fully–Depleted SOI MOSFETs", Yu et al., Solid–State Electronics, vol. 39, No. 12, 1996, pp. 1791–1794.

Hot–Carrier Effect in Ultra–Thin–Film (UTF) Fully–Depleted SOI MOSFET's, Yu, et al. 54$^{th}$ Annual Device Research Conference Digest (Cat. No. 96$^{TH}$8193), pp. 22–23.

"SOI MOSFET Design for All–Dimensional Scaling with Short Channel, Narrow Width and Ultra–thin Films", Chan et al., IEEE IEDM, 1995, pp. 631–634.

"A Novel Silicon–On–Insulator (SOI) MOSFET for Ultra Low Voltage Operation", Assaderaghi et al., 1994 IEEE Symposium on Low Power Electronics, pp. 58–59.

"Interface Characterization of Fully–Depleted SOI MOSFET by a Subthreshold I–V Method", Yu et al., Proceedings 1994 IEEE International SOI Conference, Oct. 1994, pp. 63–64.

"A Capacitorlses Double–Gate DRAM Cell Design for High Density Applications", Kuo et al., IEEE IEDM, Feb. 2002, pp. 843–846.

"A Dynamic Threshold Voltage MOSFET (DTMOS) for Ultra–Low Voltage Operation", Assaderaghi et al., IEEE IEDM, 1994, pp. 809–812.

"A Capacitorless DRAM Cell on SOI Substrate", Wann et al., IEEE IEDM 1993, pp. 635–638.

"Studying the Impact of Gate Tunneling on Dynamic Behaviors of Partially–Depleted SOI CMOS Using BSIMPD", Su et al., IEEE Proceedings of the International Symposium on Quality Electronic Design (ISQED '02), Apr. 2002 (5 pages).

"Characterization of Front and Back Si–SiO$_2$ Interfaces in Thick– and Thin–Film Silicon–on–Insulator MOS Structures by the Charge–Pumping Technique", Wouters et al., IEEE Transactions on Electron Devices, vol. 36, No. 9, Sep. 1989, pp. 1746–1750.

"An Analytical Model for the Misis Structure in SOI MOS Devices", Tack et al., Solid–State Electronics vol. 33, No. 3, 1990, pp. 357–364.

"A Long Data Retention SOI DRAM with the Body Refresh Function", Tomishima et al., IEICE Trans. Electron., vol. E80–C, No. 7, Jul. 1997, pp. 899–904.

"High–Endurance Ultra–Thin Tunnel Oxide in MONOS Devices Structure for Dynamic Memory Application", Wann et al., IEEE Electron Device Letters, vol. 16, No. 11, Nov. 1995, pp. 491–493.

"Capacitor–Less 1–Transistor DRAM", Fazan et al., 2002 IEEE International SOI Conference, Oct. 2002, pp. 10–13.

"SOI (Silicon–on–Insulator) for High Speed Ultra Large Scale Integration", C. Hu, Jpn. J. Appl. Phys. vol. 33 (1994) pp. 365–369, Part 1, No. 1B, Jan. 1994.

"Source–Bias Dependent Charge Accumulation in P+–Poly Gate SOI Dynamic Random Access Memory Cell Transistors", Sim et al., Jpn. J. Appl. Phys. vol. 37 (1998) pp. 1260–1263, Part 1, No. 3B, Mar. 1998.

"Suppression of Parasitic Bipolar Action in Ultra–Thin––Film Fully–Depleted CMOS/SIMOX Devices by Ar–Ion Implantation into Source/Drain Regions", Ohno et al., IEEE Transactions on Electron Devices, vol. 45, No. 5, May 1998, pp. 1071–1076.

"Fully Isolated Lateral Bipolar–MOS Transistors Fabricated in Zone–Melting–Recrystallized Si Films on SiO$_2$", Tsaur et al., IEEE Electron Device Letters, vol. EDI–4, No. 8, Aug. 1983, pp. 269–271.

"Silicon–On–Insulator Bipolar Transistors", Rodder et al., IEEE Electron Device Letters, vol. EDL–4, No. 6, Jun. 1983, pp. 193–195.

"Characteristics and Three–Dimensional Integration of MOSFET's in Small–Grain LPCVD Polycrystalline Silicon", Malhi et al., IEEE Transactions on Electron Devices, vol. ED–32, No. 2, Feb. 1985, pp. 258–281.

"Triple–Wel nMOSFET Evaluated as a Capacitor–Less DRAM Cell for Nanoscale Low–Cost & High Density Applications", Villaret et al., Handout at Proceedings of 2003 Silicon Nanoelectronics Workshop, Jun. 8–9, 2003, Kyoto, Japan (2 pages).

"Mechanisms of Charge Modulation in the Floating Body of Triple–Well NMOSFET Capacitor–less DRAMs", Handout at Proceedings of INFOS 2003, Jun. 18–20, 2003, Barcelona, Spain (2 pages).

"Embedded DRAM Process Technology", M. Yamawaki, Proceedings of the Symposium on Semiconductors and Integrated Circuits Technology, 1998, vol. 55, pp. 38–43.

"3–Dimensional Simulation of Turn–off Current in Partially Depleted SOI MOSFETs", Ikeda et al., IEIC Technical Report, Institute of Electronics, Information and Communication Engineers, 1998, vol. 97, No. 557 (SDM97 186–198), pp. 27–34.

DRAM Design Using the Taper–Isolated Dynamic RAM Cell, Leiss et al., IEEE Transactions on Electron Devices, vol. ED–29, No. 4, Apr. 1982, pp707–714.

* cited by examiner

Binary memory

Multilevel memory

SEMICONDUCTOR DEVICE

RELATED APPLICATION

This application is a divisional application of application Ser. No. 10/450,238 (still pending), filed Jun. 10, 2003, which is the National Stage of International Application No. PCT/EP02/06495, filed Jun. 5, 2002.

BACKGROUND

The present invention relates to semiconductor devices, and relates particularly, but not exclusively, to DRAM memory devices using SOI (silicon on insulator) technology.

DRAM memories are known in which each memory cell consists of a single transistor and a single capacitor, the binary 1's and 0's of data stored in the DRAM being represented by the capacitor of each cell being in a charged or discharged state. Charging and discharging of the capacitors is controlled by switching of the corresponding transistor, which also controls reading of the data stored in the cell. Such an arrangement is disclosed in U.S. Pat. 3,387,286 and will be familiar to persons skilled in the art.

Semiconductor devices incorporating MOSFET (metal oxide semiconductor field effect transistor) type devices are well known, and arrangements employing SOI (silicon on insulator) are becoming increasingly available. SOI technology involves the provision of a silicon substrate carrying an insulating silicon dioxide layer coated with a layer of silicon in which the individual field effect transistors are formed by forming source and drain regions of doped silicon of one polarity separated by a body of doped silicon of the opposite polarity.

SOI technology suffers the drawback that because the body region of each individual transistor is electrically insulated from the underlying silicon substrate, electrical charging of the body can occur under certain conditions. This can have an effect on the electrical performance of the transistors and is generally regarded as an undesirable effect. Extensive measures are generally taken to avoid the occurrence of this effect, as described in more detail in a "Suppression of parasitic bipolar action in ultra thin film fully depleted CMOS/simox devices by Ar-ion implantation into source/drain regions", published by Terukazu Ohno et al. in IEEE Transactions on Electron Devices, Vol. 45, Number 5, May 1998.

A known DRAM device is also described in U.S. Pat. 4,298,962, in which the DRAM is formed from a plurality of cells, each of which consists of an IGFET (insulated gate field effect transistor) formed directly on a silicon substrate. This DRAM enables the injection of charge carriers from a semiconductor impurity region of opposite polarity to the polarity of the source and drain regions and which is located in the source or drain, or the injection of charge carriers from the silicon substrate.

This known device suffers from the drawback that it requires at least four terminal connections for its operation (connected to the drain, gate, source and impurity region of opposite polarity or to the substrate), which increases the complexity of the device. Furthermore, the memory function of each cell is ensured only while voltages are being applied to the transistor source and drain, which affects the reliability of the device, and writing, reading and refreshing of the stored information must be performed in so-called "punch through" mode, which results in heavy power consumption by the device.

An attempt to manufacture DRAM memories using SOI technology is disclosed in U.S. Pat. 5,448,513. In that known device, each memory cell is formed from two transistors, one of which is used for writing data to the memory cell, and one of which is used for reading data stored in the device. As a result of each cell consisting of two separate transistors, each cell requires four terminal connections for its operation, which increases the complexity of the device, as well as the surface area necessary for each memory cell as a result of the provision of two transistors.

Preferred embodiments of the present invention seek to overcome the above disadvantages of the prior art.

SUMMARY OF THE INVENTION

According to an aspect of the present invention, there is provided a semiconductor device comprising:

a substrate:

at least one data storage cell provided on one side of said substrate, wherein the or each said data storage cell comprises a respective field effect transistor comprising (i) a source; (ii) a drain; (iii) a body arranged between said source and said drain and adapted to at least temporarily retain a net electrical charge generated in said body such that the magnitude of said net charge can be adjusted by input signals applied to said transistor; and (iv) at least one gate adjacent said body; and charge adjusting means for at least partially cancelling the adjustment of said net electrical charge by said input signals, by applying first predetermined electrical voltage signals between at least one corresponding said gate and the corresponding said drain and between the corresponding said source and said drain. The present invention is based upon the surprising discovery that the previously undesirable characteristic of excess electrical charge generated and retained in the body of the transistor can be used to represent data. By providing a semiconductor device in which data is stored as an electrical charge in the body of a field effect transistor, this provides the advantage that a much higher level of circuit integration is possible than in the prior art, since each data cell, for example when the semiconductor device is a DRAM memory, no longer requires a capacitor and can consist of a single transistor. Furthermore, by generating said electrical charge in the body of the field effect transistor (as opposed to in the substrate or in an impurity region provided in the source or drain), this provides the further advantage that no specific connection need be made to the substrate or impurity region, thus reducing the number of terminal connections necessary to operate the device.

In a preferred embodiment, said input signals comprise second predetermined electrical voltage signals applied between at least one corresponding said gate and the corresponding said drain and between the corresponding said source and said drain. The device may be a memory device.

The device may be a sensor and the charge stored in at least one said body in use represents a physical parameter. The input signals comprise electromagnetic radiation.

The device may be an electromagnetic radiation sensor.

The device may further comprise a first insulating layer at least partially covering said substrate, wherein the or each said data storage cell is provided on a side of said first insulating layer remote from said substrate.

The first insulating layer may comprise a layer of semiconductor material of opposite doping type to the body of the or each said data storage cell. By providing a layer of material of opposite doping type to the transistor body (e.g., a layer of n-type material in the case of a p-type transistor body), this provides the advantage that by suitable biasing of the insulating layer such that the body/insulating layer junction is reverse biased, adjacent transistors can be electrically isolated from each other without the necessity of using silicon-on-insulator (SOI) technology in which a layer of dielectric material such as silicon oxide is formed on a silicon substrate. This in turn provides the advantage that devices according to the invention can be manufactured using conventional manufacturing techniques.

The device may further comprise a respective second insulating layer provided between at least one said body and/or each corresponding said gate.

In a preferred embodiment, at least one said transistor includes a plurality of defects in the vicinity of the interface between at least one corresponding said body and the corresponding said second insulating layer, for trapping charge carriers of opposite polarity to the charge carriers stored in the body.

This provides the advantage of enabling the charge stored in the body of the transistor to be reduced by means of recombination of the stored charge carriers with charge carriers of opposite polarity trapped in the vicinity of the interface.

The density of defects in the vicinity of said interface may be between $10^9$ and $10^{12}$ per $cm^2$.

The device may further comprise data reading means for causing an electrical current to flow between a said source and a said drain of at least one said data storage cell by applying third predetermined electrical voltage signals between at least one corresponding said gate and said drain and between said source and said drain.

The first insulating layer may comprise a plurality of insulating layers.

At least one said data storage cell may be adapted to store at least two distinguishable levels of said electrical charge.

In a preferred embodiment, at least one said data storage cell is adapted to store at least three distinguishable levels of said electrical charge.

This provides the advantage that the more distinguishable charge levels there are which can be used to represent data in a data storage cell, the more bits of data can be stored in each cell. For example, in order to represent n bits of data, $2^n$ distinguishable charge levels are required, as a result of which high density data storage devices can be created.

At least one said transistor may have a drain/body capacitance greater than the corresponding source/body capacitance.

This provides the advantage of reducing the voltages which need to be applied to the transistor to adjust the charge stored in the body thereof, which in turn improves reliability of operation of the device.

The body of at least one said transistor may have a higher dopant density in the vicinity of said drain than in the vicinity of said source.

The area of the interface between the drain and body of at least one said transistor may be larger than the area of the interface between the source and the body.

Common source and/or drain regions may be shared between adjacent transistors of said device.

This provides the advantage of improving the extent to which the device can be miniaturised.

According to another aspect of the present invention, there is provided a method of storing data in a semiconductor device comprising a substrate, and at least one data storage cell provided on one side of said substrate, wherein the or each said data storage cell comprises a respective field effect transistor comprising (i) a source; (ii) a drain; (iii) a body arranged between said source and said drain and adapted to at least temporarily retain a net electrical charge generated in said body such that the magnitude of said net charge can be adjusted by input signals applied to said transistor; and (iv) at least one gate adjacent said body; the method comprising the steps of: applying first predetermined electrical voltage signals between at least one corresponding said gate and the corresponding said drain and between the corresponding said source and said drain to at least partially cancel the adjustment of said net charge by said input signals.

The method may further comprise the step of applying second predetermined electrical voltage signals between at least one said gate of a said data storage cell and the corresponding said drain and between the corresponding said source and said drain.

The step of applying second predetermined said electrical signals may adjust the charge retained in the corresponding said body by means of the tunnel effect.

This provides the advantage of enabling the charge adjustment to be carried out in a non-conducting state of the transistor in which the only current is the removal of minority charge carriers from the body of the transistor. This in turn enables the charge adjustment operation to involve very low power consumption. This also provides the advantage that a considerably higher charge can be stored in the body of the transistor since, it is believed, the charge is stored throughout substantially the entire body of the transistor, as opposed to just that part of the transistor in the vicinity of the first insulating layer. As a result, several levels of charge can be stored, representing several bits of data.

The charge may be adjusted by the application of a voltage signal between at least one said gate and the corresponding drain such that at the interface between the corresponding body and the drain, the valence and conduction bands of the body and drain are deformed to inject electrons from the valence band to the conduction band by the tunnel effect, causing the formation of majority carriers in the body.

Said charge may be adjusted by means of tunnelling of electrons from the valence band to at least one gate of a said field effect transistor.

The step of applying first predetermined said voltage signals may comprise applying electrical voltage signals between at least one said gate and the corresponding said drain such that at least some of the charge carriers stored in the corresponding body recombine with charge carriers of opposite polarity in said body.

This provides the advantage that the charge stored in the particular transistor body can be adjusted without the transistor being switched into a conductive state, as a result of which the charge adjustment can be carried out at very low power consumption. This feature is especially advantageous in the case of a semiconductor device incorporating a large number of transistors, such as an optical detector in which individual pixels are provided by transistors.

The process, operating under the principle known as charge pumping, and described in more detail in the article by G. Groeseneken et al., "A reliable approach to charge pumping measurements in MOS transistors", IEEE Transactions on Electron Devices, Vol. 31, pp. 42 to 53, 1984, provides the advantage that it operates at very low current levels, which enables power consumption in devices operating according to the process to be minimised.

The method may further comprise the step of applying at least one said voltage signal comprising a first part which causes a conducting channel to be formed between the source and the drain, the channel containing charge carriers of opposite polarity to the charge carriers stored in said body, and a second part which inhibits formation of the channel, and causes at least some of said stored charge carriers to migrate towards the position previously occupied by said channel and recombine with charge carriers of opposite polarity previously in said channel.

The method may further comprise the step of repeating the step of applying at least one said voltage signal in a single charge adjustment operation sufficiently rapidly to cause at least some of said charge carriers stored in the body to recombine with charge carriers of opposite polarity before said charge carriers of opposite polarity can completely migrate to said source or said drain.

BRIEF DESCRIPTION OF THE DRAWINGS

Preferred embodiments of the invention will now be described, by way of example only and not in any limitative sense, with reference to the accompanying drawings, in which.

DETAILED DESCRIPTION

Figure 1:
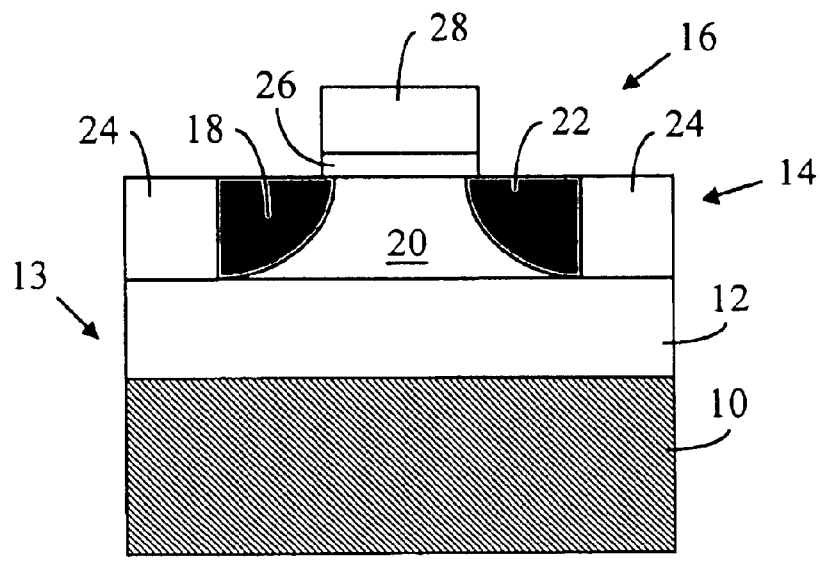
FIG. 1 is a schematic representation of a first embodiments of a MOSFET type SOI transistor for use in a semiconductor device embodying the present invention.

Referring firstly to FIG. 1, an NMOS SOI (silicon on insulator) MOSFET (metal-oxide-silicon field effect transistor) comprises a silicon wafer 10 coated with a layer 12 of silicon dioxide, the wafer 10 and layer 12 constituting a substrate 13. A layer 14 formed on the substrate 13 consists of an island 16 of silicon doped with impurities to form a source 18 on n-type material, a body 20 of p-type material and a drain 22 of n-type material, together with a honeycomb insulating structure 24 of silicon dioxide, the honeycomb structure being filled by a plurality of islands 16. The source 18 and drain 22 extend through the entire thickness of the silicon layer 14. An insulating film 26 is formed over body 20, and a gate 28 of doped semiconductor material is provided on dielectric film 26. The production process steps, chemical compositions and doping conditions used in manufacturing the transistor of FIG. 1 will be familiar to persons skilled in the art, and are also described in further detail in "SOI: Materials to Systems" by A. J. Auberton-Hervé, IEDM 96. This publication also discloses that transistors of this type have an electrical instability as a result of the fact that the body 20 is electrically floating, and can therefore acquire an electrical charge, depending upon the sequence of voltage pulses applied to the transistor.

The transistor shown in FIG. 1 is of the type known to persons skilled in the art as "partially depleted" (PD), in which the depletion regions (i.e., those regions forming junctions between semiconductor types of opposite polarity and which are depleted of free charge carriers) do not occupy the entire thickness of the silicon layer 14.

Figure 2:
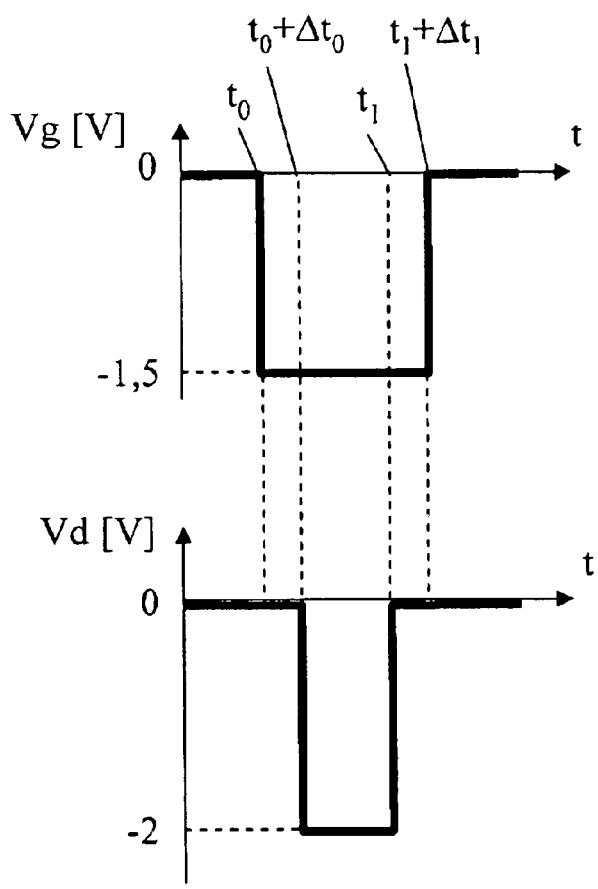
FIG. 2 shows a sequence of electrical pulses to be applied to the transistor of FIG. 1 to generate a positive charge in the body of the transistor according to a first method.

Referring now to FIG. 2, in order to generate a positive charge in the body of the NMOS transistor of FIG. 1, the gate voltage $V_g$ and drain voltage $V_d$, as well as the source voltage, are initially zero. At time $t_0$, the gate voltage is brought to −1.5V and at time $t_0 + \Delta t_0$ (where $\Delta t_0$ can be greater than, less than or equal to zero), the drain voltage $V_d$ is brought to −2V, while the source voltage remains at zero volts. By applying a negative voltage pulse to the gate 28 and a more negative voltage pulse to the drain 22, a concentration of negative charge forms in the body 20 in the vicinity of the gate 28, while a concentration of positive charge forms in the body 20 in the vicinity of insulating layer 12. At the same time, a conduction channel linking the source 18 and drain 22 forms in the body 20, allowing conduction of electrons between the source 18 and drain 22. This allows electrons to be attracted into the channel from the source 18 and/or drain 22.

The application of a negative voltage to the drain 22 relative to the source 18 as shown in FIG. 2 generates electron-hole pairs by impact ionisation in the vicinity of the source 18. The holes accumulated in the floating body 20 create a positive charge.

The voltage $V_d$ applied to the drain 22 then returns at time $t_1$ to zero, and the voltage $V_g$ applied to the gate 28 returns to zero at $t_1 + \Delta t_1$ to remove the conductive channel between the source 18 and drain 22, the time interval $t_1 - t_0$ to typically being between a few nanoseconds and several tens of nanoseconds, while $\Delta t_1$ is of the order of 1 nanosecond. It is also possible to create a positive charge in the body 20 by applying a positive voltage pulse to the drain 22, depending upon the voltages applied to the source 18, drain 22 and gate 28 relative to each other. It has been found in practice that in order to create a positive charge in the body 20, the voltage applied to the drain 22 must be switched back to zero volts before the voltage applied to the gate 28 is switched back to zero volts.

Figure 3:
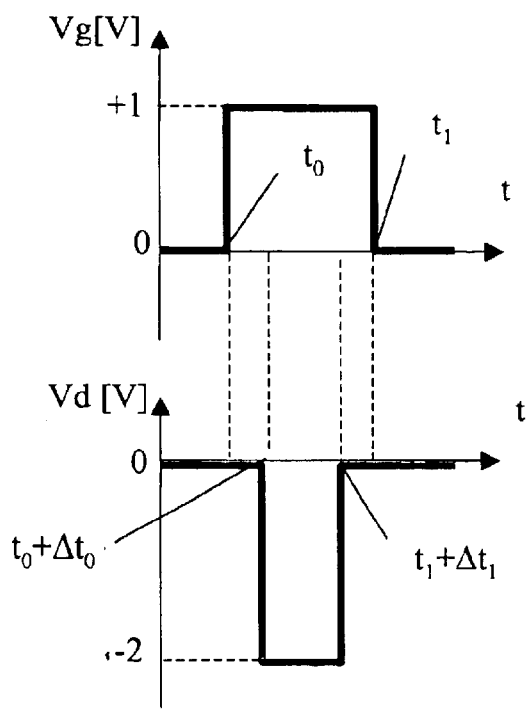
FIG. 3 shows a sequence of electrical pulses to be applied to the transistor of FIG. 1 to generate a negative charge in the body of the transistor according to a first method.

Referring now to FIG. 3, a negative charge is generated in the body 20 by increasing the voltage $V_g$ applied to the gate 28 to +1V at $t_0$ while the voltages applied to the source 18 and drain 22 are held at zero volts, then reducing the voltage $V_d$ applied to the drain 22 to −2V at time $t_0 + \Delta t_0$ while the voltage applied to the source 18 is held at zero volts. The voltage $V_g$ applied to the gate 28 and voltage $V_d$ applied to the drain 22 are then subsequently brought to zero volts at times $t_1$ and $t_1 + \Delta t_1$ respectively, where $\Delta t_1$ can be positive or negative (or zero). The application of a positive voltage to the gate 28 relative to the voltages applied to the source 18 and drain 22 again causes the formation of a conductive channel between the source 18 and drain 22, as was the case with the formation of an excess positive charge as described above with reference to FIG. 2. The positive voltage applied to the gate 28 also creates a concentration of negative charge in the body 20 in the vicinity of the gate 28, and a concentration of positive charge in that part of the body 20 which is remote from the gate 28, i.e., adjacent the insulating layer 12.

As a result of the application of the negative voltage to the drain 22, the body-drain junction is forward biased, as a result of which holes are conducted out of the body 20 to the drain 22. The effect of this is to create an excess of negative charge in the body 20. It should be noted that under these bias conditions the generation of holes by impact ionisation is fairly weak. Alternatively, a positive voltage pulse can be applied to the drain 22 and the gate 28, as a result of which the body-source junction is forward biased and the holes are removed from the body 20 to the source 18. In a similar way, instead of generating a negative charge in the body 20, a positive charge stored in the body 20 can be removed.

Figure 4:
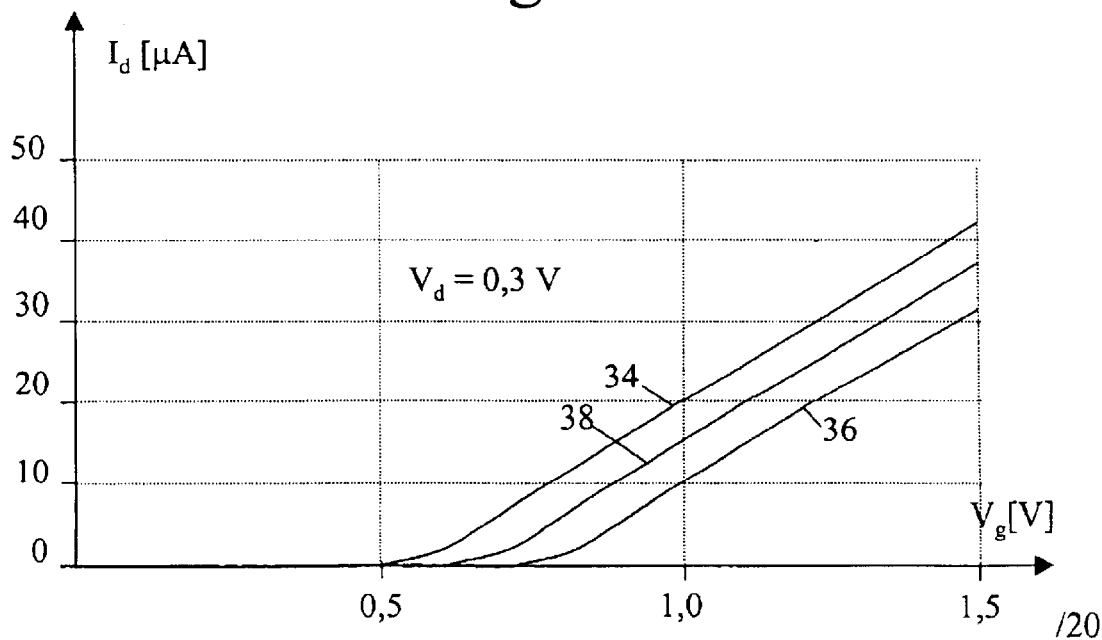
FIG. 4 shows the variation in source-drain current of the transistor of FIG. 1 as a function of gate voltage, with the body of the transistor being positively charged, uncharged and negatively charged.

Referring now to FIG. 4, the drain current $I_d$ is dependent upon the applied gate voltage $V_g$, and the Figure shows this relationship for a drain voltage $V_d$ of 0.3V, the curves 34, 36 and 38 representing the body 20 having an excess of positive or negative charge, or zero excess charge, respectively. It will therefore be appreciated that by the application of calibrated voltages to gate 28 and drain 22 and by measuring drain current $I_d$, it is possible to determine whether body 20 is positively or negatively charged, or whether it is uncharged. This phenomenon enables the transistor of FIG. 1 to be used as a data storage cell, different charging levels representing data "high" and "low" states, or some physical parameter to be measured, as will be described in greater detail below.

Figures 5A, 5B:
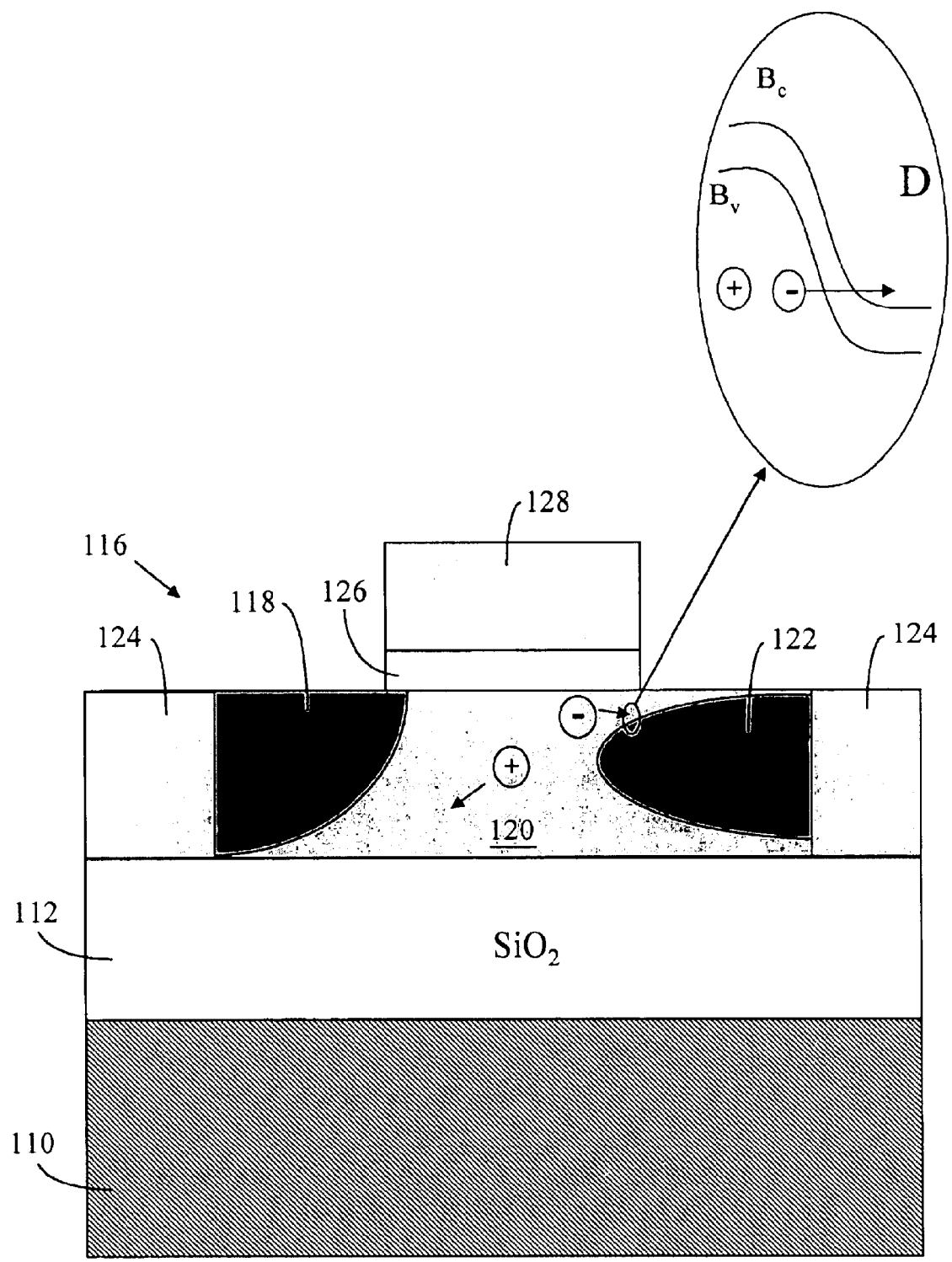
FIG. 5a is a schematic representation of an SOI MOSFET transistor of a second embodiment for use in a semiconductor device embodying the present invention.
FIG. 5b is a representation of the effect of the application of a gate voltage to the transistor of FIG. 5a on the valence and conduction bands of the transistor.

Referring to FIG. 5a, in which parts common to the embodiment of FIG. 1 are denoted by like reference numerals but increased by 100, a further embodiment of an SOI transistor is shown in which the transistor is caused to store a positive charge in its body 120 by means of the tunnel effect. The transistor of FIG. 5a is manufactured by a succession of photo lithographic, doping and etching operations which will be familiar to persons skilled in the art. The transistor is made to 0.13 $\mu$m technology with a p-type dopant density of $10^{18}$ atoms per cm$^3$ in the body 120 and of $10^{21}$ n-type atoms per cm$^3$ in the drain 122. The insulating layer 126 has a thickness of the order of 2 nm.

In order to operate the transistor of FIG. 5a, the source is held at 0V, the gate voltage $V_g$ applied to the gate 128 is −1.5V and the voltage $V_d$ applied to the drain 122 is +1V. This causes the tunnel effect at the interface of the body 120 and drain 122 as a result of the fact that the valence band $B_v$ and conduction band $B_c$, represented schematically in FIG. 5b, are distorted. Folding of these bands can be achieved by an electric field of the order of 1MV/cm, which results in electrons being extracted by the drain 122, while the associated holes remain in the body 120. This physical phenomenon is known as "GIDL" (Gate Induced Drain Leakage), described in greater detail for example in the article by Chi Chang et al "Corner Field Induced Drain Leakage in Thin Oxide MOSFETS", IEDM Technical Digest, Page 714, 1987.

The charging operation of FIG. 5a has the advantage over that described with 20 reference to FIGS. 1 to 3 that the only current flowing during the charging process is the extraction of electrons from the body 120 by the tunnel effect. As a result, charging occurs at very low power consumption. Furthermore, it has been found that the charge which can be stored in the body 120 is considerably higher (approximately twice as large) than that obtained by previous methods. It is believed that this is as a result of the fact that a charge is stored throughout the entire volume of the body 120, not just in that part of the body 120 adjacent to the insulating layer 112.

It will be appreciated by persons skilled in the art that the process of FIG. 5a, which was described with reference to NMOS transistors, can also be applied to PMOS transistors, in which case the gate voltage is positive and the drain voltage negative, and holes are extracted by the drain while electrons are trapped.

Figure 6A:
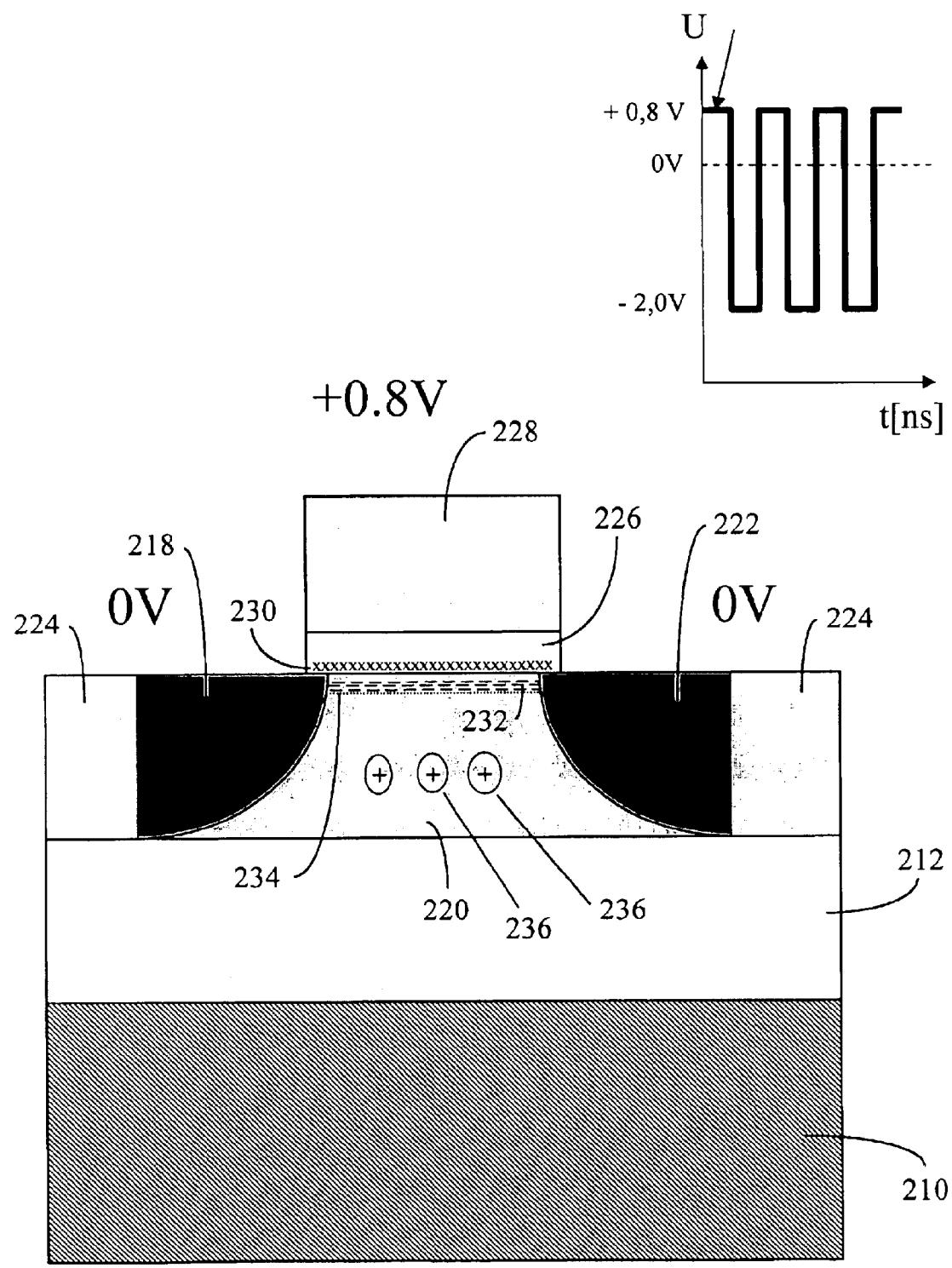
FIGS. 6a to 6c illustrate a first method embodying the present invention of eliminating a positive charge stored in the body of the transistor of FIG. 1.
Figure 6B:
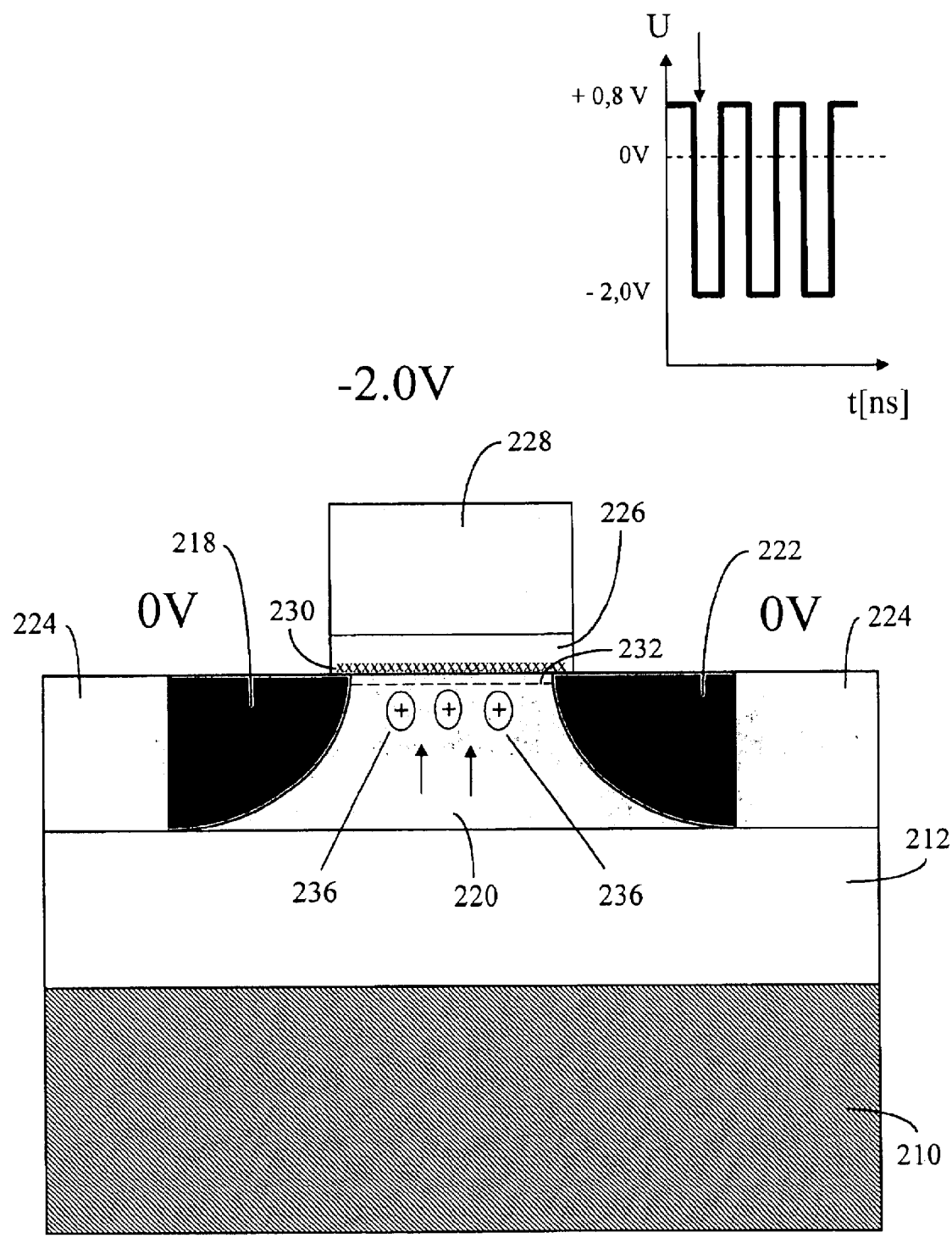
Figure 6C:
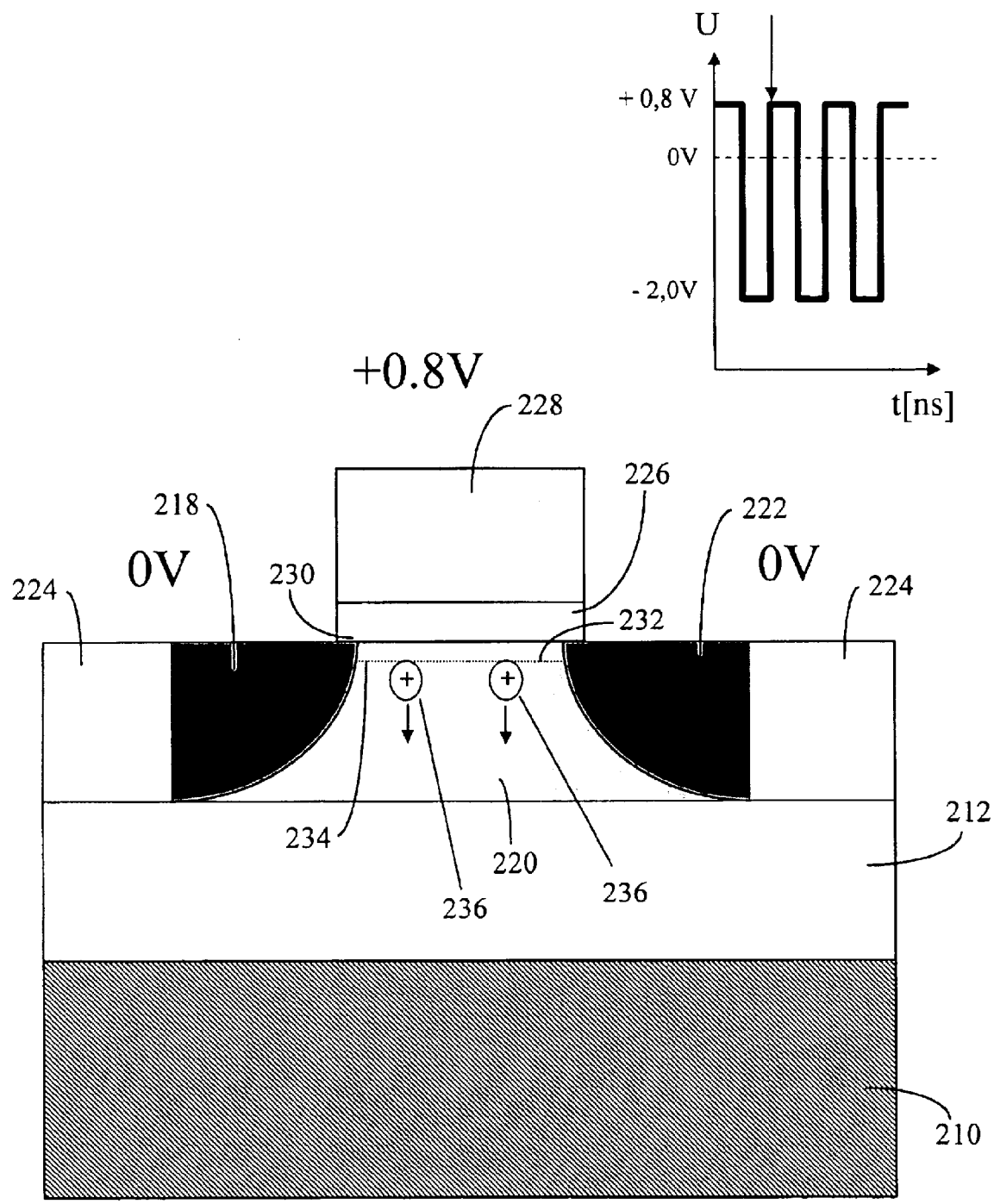

Referring now to FIGS. 6a to 6c, in which parts common to the embodiment of FIG. 1 are denoted by like reference numerals but increased by 200, a process is described for removing charge stored in the body 220 of the transistor. It is important that the body 220 of the transistor and the insulating film 226 be separated by an interface 230 a few atomic layers thick which provides defects forming sites to which electrons can attach.

In order to remove the charge stored in the body 220, a cyclical signal shown in the upper part of FIG. 6a is applied to the gate, the instant illustrated by FIG. 6a being shown by an arrow in the insert. Initially, a potential of 0V is applied to the source 218 and drain 222, and then a potential of 0.8V is applied to gate 228. This has the effect of creating a conducting channel 232 at interface 230, and electrons are attracted into the channel 232 from the source 218 and/or drain 222. The channel 232 has a high density of electrons 234, as a result of the positive voltage applied to gate 228, of which some are attached to defects at the interface 230.

When a voltage of −2.0V is then applied to gate 228, as indicated FIG. 6b, the channel 232 disappears, but the bound electrons 234 remain in the interface 230. Moreover, the voltage applied to the gate 228 tends to cause holes 236 to migrate towards the interface 230 where they recombine with the bound electrons 234. As can be seen in FIG. 6c, when a further cycle is applied beginning with the application of a voltage of 0.8V to gate 228, the channel 232 is again formed. However, compared to the situation illustrated in FIG. 6a, the number of holes 236 has decreased.

The interface 230 preferably has a defect density between $10^9$ and $10^{12}$ per cm$^2$, this density and the number of oscillations necessary to remove the particles forming the stored charge representing an acceptable compromise between device performance being limited by the number of defects and assisted by the number of trapped electrons. The pulse duration is typically about 10 ns, the rise and falling time being of the order of 1 ns. It should also be noted that in certain types of transistors, it is also possible to form a channel between the source 218 and the drain 222 in the vicinity of the insulating layer 212. In such a case, the conditions for recombination of charge carriers are slightly different, but the principle of operation is generally the same.

Figure 7A:
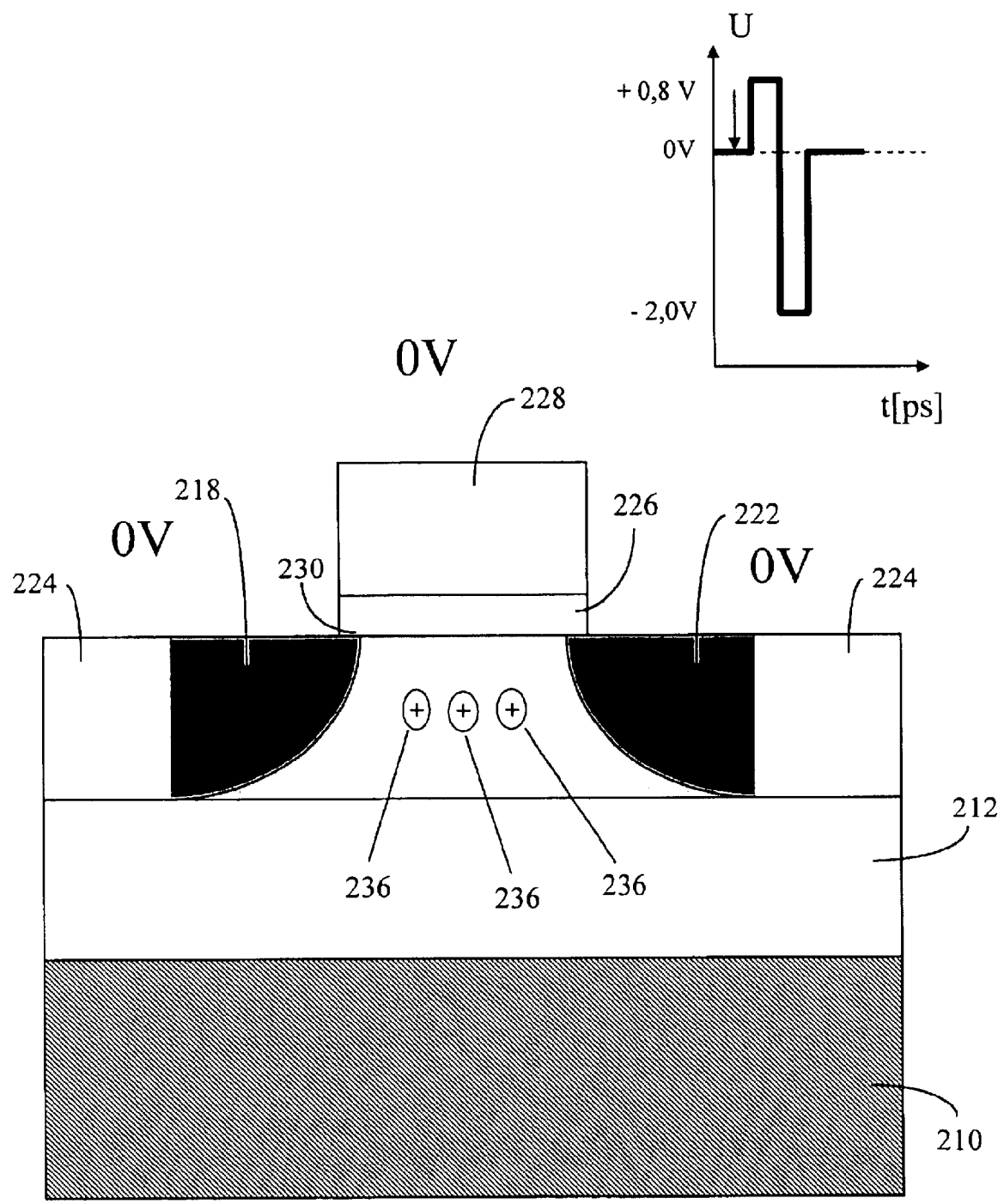
FIGS. 7a to 7d illustrate a second method embodying the present invention of eliminating a positive charge stored in the body of the transistor of FIG. 1.
Figure 7B:
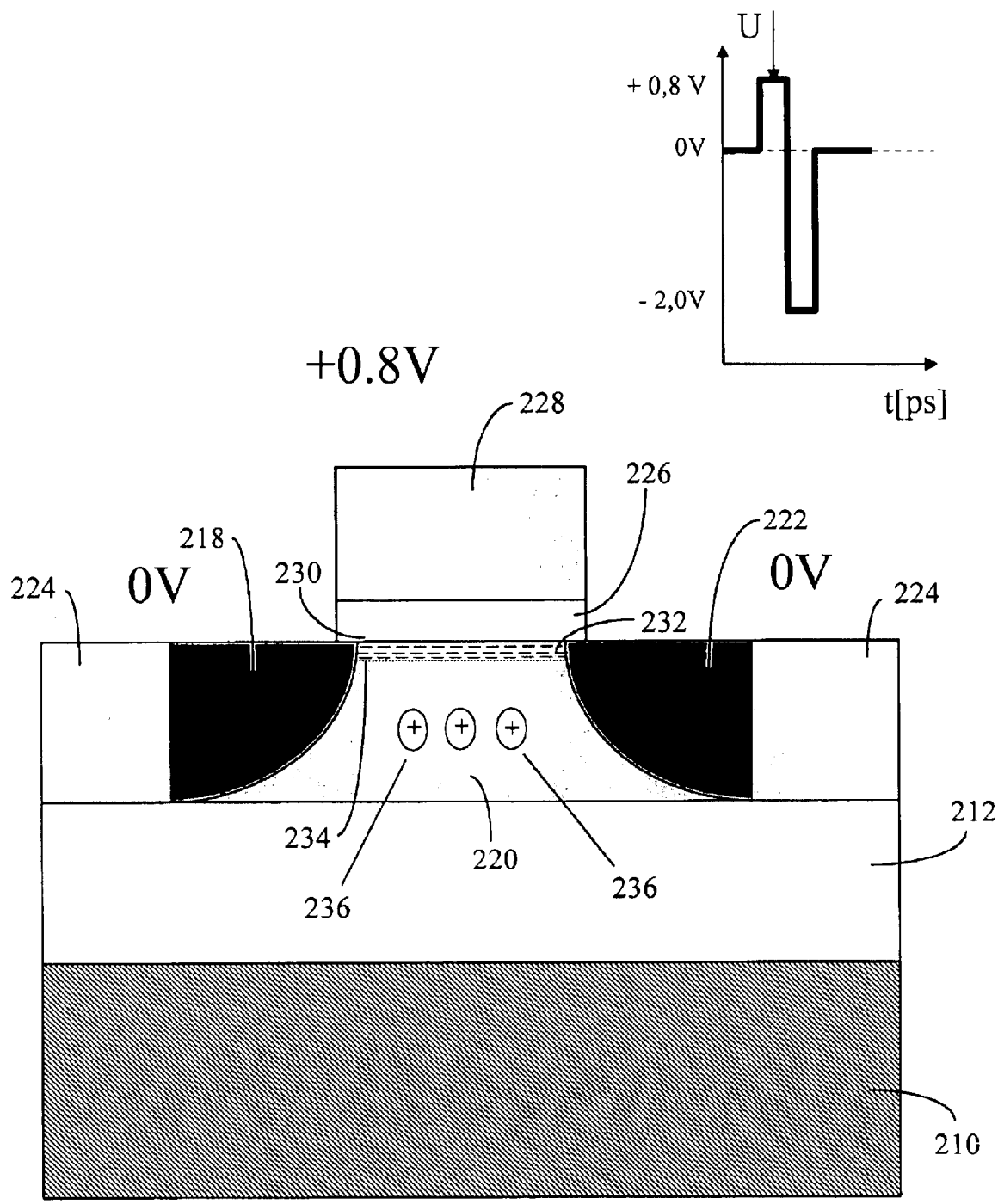

FIG. 7a shows a transistor identical in construction to that of FIGS. 6a to 6c, but which enables the stored charge to be reduced more rapidly than in the case of FIGS. 6a to 6c using recombination of charges at the interface 230, but without having electrons bound to defects. FIG. 7a shows the state of the transistor before the charge reduction process is commenced, the body 220 having an excess of holes 236. By applying a positive voltage, for example 0.8V, to gate 228 as shown in FIG. 7b, while keeping the source and drain at 0V, a channel 232 at the interface 230 is created. The channel 232 contains an excess of electrons 234, depending on the positive voltage applied to the gate 228, the quantity of free electrons 234 significantly exceeding that of the holes 236 present in the body 220 because of attraction of electrons into the channel 232 from the source 218 and/or drain 222.

Figure 7C:
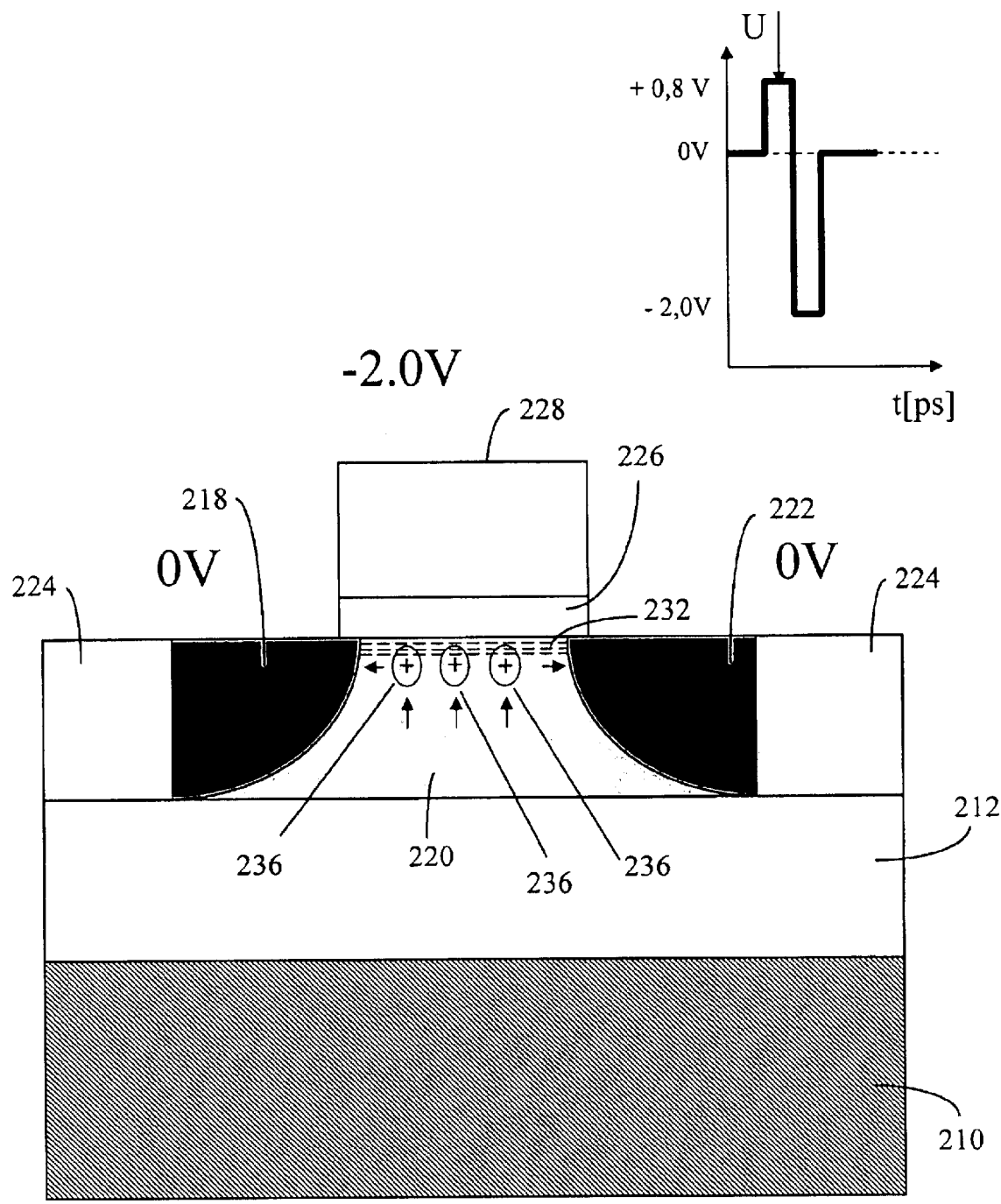
Figure 7D:
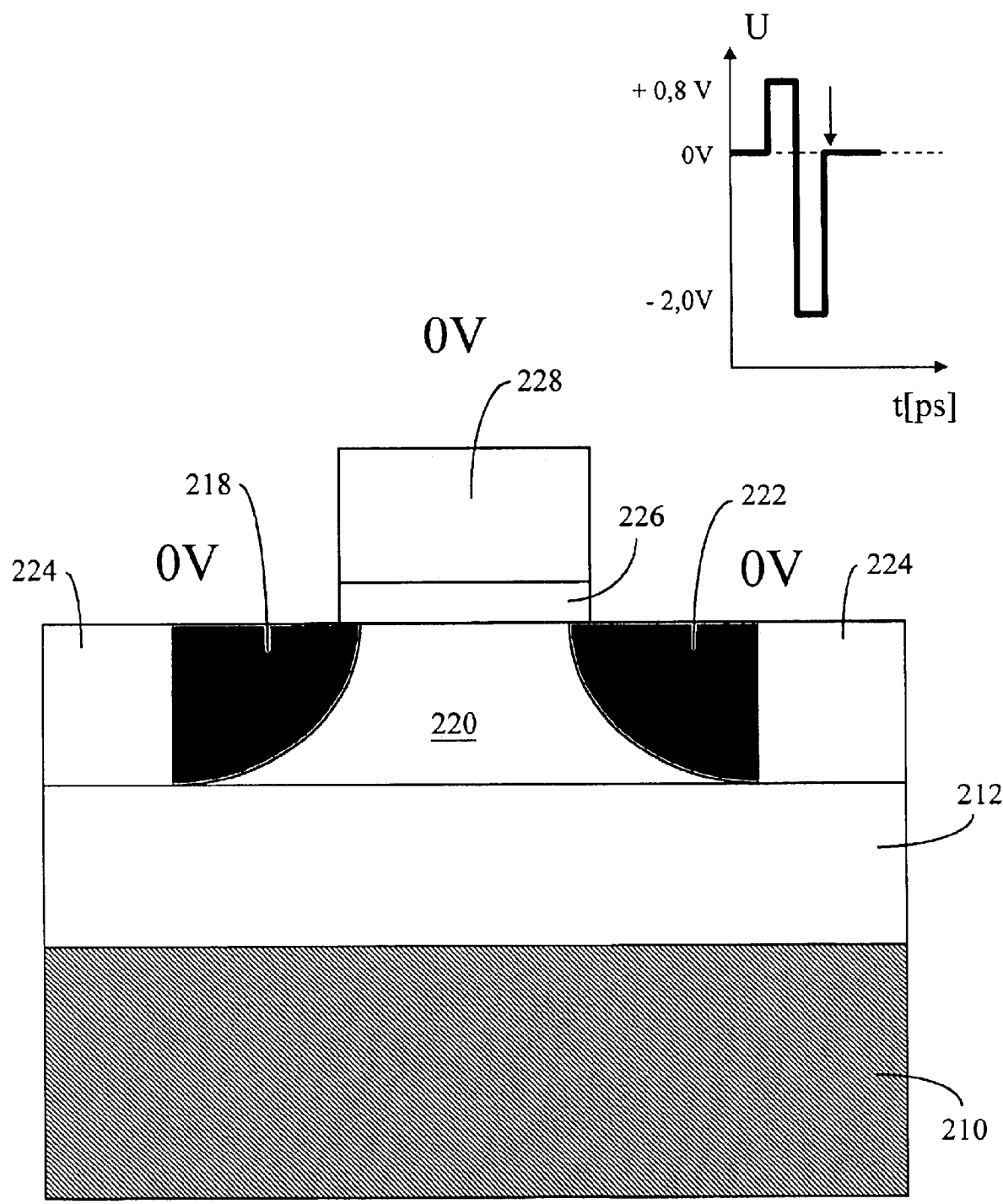

It can be shown that by rapidly reversing the polarity of the signal applied to the gate 228, for example from 0.8V to −2.0V in a time of the order of a picosecond, the electrons 234 located in the channel 232 do not have time to migrate before the holes 236 contained in the body 220 arrive in the space previously occupied by the channel 232, as shown in FIG. 7c. The holes 236 and electrons 234 recombine in the interior of the body 220 without current flowing between the source and the drain, while the excess electrons 234 migrate towards the source 218 and the drain 222. In this way, after a very short period of time, all of the holes 236 of the stored charge are recombined, as shown in FIG. 7d.

In order to achieve the switching speeds necessary for the above process to be utilized in a semiconductor device, it is necessary to reduce the resistance and parasitic capacitances of the circuits and control lines as far as possible. In the case of memories, this can cause a limitation of the number of transistors per line and per column. However, this limitation is significantly compensated by the significant increases in the speed with which the stored charge is removed.

The charge removal process described with reference to FIGS. 6 and 7 can be enhanced by providing an asymmetrical source/drain junction to give larger junction capacitance on the drain side. In the arrangement described with reference to FIGS. 1 to 3, it is observed that in order to ensure fast writing of data states represented by the charge level (i.e., in a few nanoseconds), fairly high voltages need to be used, but that these voltages need to be reduced by device optimization because of reliability problems.

Figure 8:
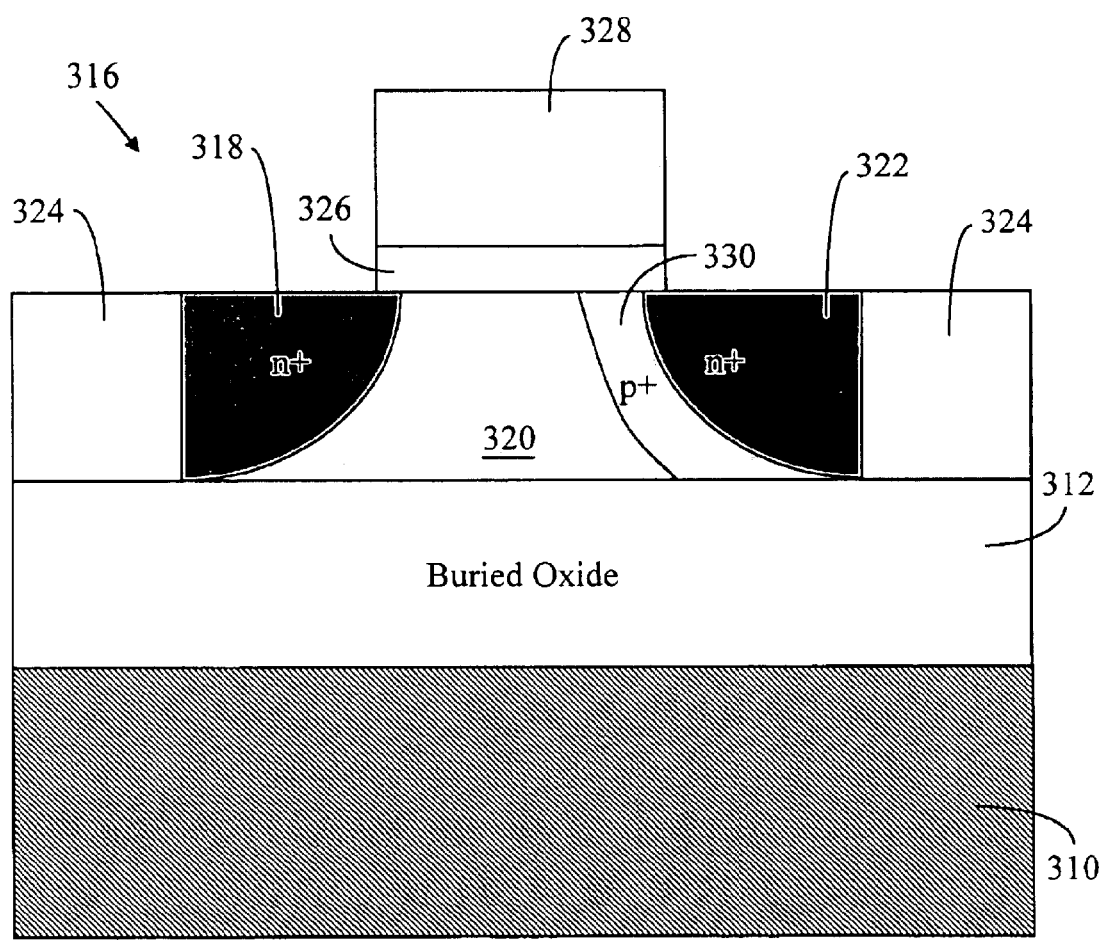
FIG. 8 is a schematic representation of a SOI MOSFET transistor of a third embodiment for use in a semiconductor device embodying the present invention.

FIG. 8 shows a further embodiment of a transistor in which the voltage required to remove charge stored in the body 320 of the transistor is reduced. During discharging of the charged body 320, pulses are applied to the drain 322 and to the gate 328 of the transistor so that the body/source or body/drain junction is biased in a forward direction. As a result, the majority carriers are removed from the charged floating body 320, providing a decrease in channel current when the transistor is switched to its conductive state (see FIG. 4).

Figure 9:
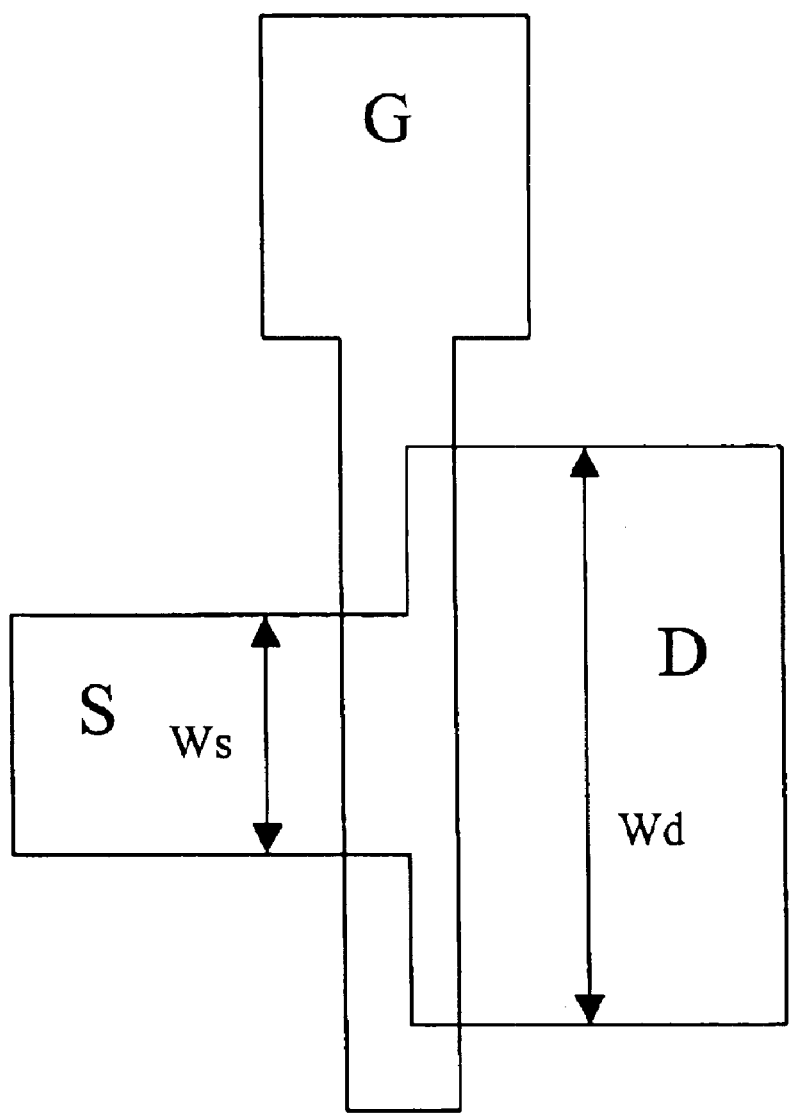
FIG. 9 is a schematic representation of the gate, source and drain areas of a transistor of a fourth embodiment for use in a semiconductor device embodying the present invention.

The potential of the floating body 320 can be altered by adjusting the voltages applied to the transistor contacts, or by altering the body/source and/or body/drain and/or body/gate capacitances. For example, if the potential of the drain 322 is positive compared to that of the source 318, the potential of the floating body 320 can be made more positive by increasing the capacitance between the drain 322 and the floating body 320. In the arrangement shown in FIG. 8, the MOSFET has different doping profiles for the drain 322 and the source 318. In particular, a P+ doped region 330 is formed in the vicinity of the drain 322, which leads to an increased capacitance between the drain 322 and the floating body 320. This is manufactured by adding an implant on the drain side only, and by diffusing this implant before forming the source and drain implanted regions. An alternative is to increase the capacitive coupling between the drain 322 and the floating body 320 by using different geometries for the drain 322 and the source 318, as shown in FIG. 9.

The improved charging and discharging techniques described with reference to FIGS. 5 to 9 enable significantly greater current differences between the uncharged and highest charged states of the transistor to be achieved. For example, in the arrangement disclosed with reference to FIGS. 1 to 3, the current difference between the maximum and minimum charge states is typically 5 to 20 $\mu A/\mu m$ of device width. For a 0.13 $\mu m$ technology, where a typical transistor width of 0.2 to 0.3 $\mu m$ would be used, this means that a current difference of about 1 to 6 $\mu A$ is available. At least 1 $\mu A$ of current is required to be able to sense the data represented by the charged state.

The charging and discharging arrangements disclosed with reference to FIGS. 5 to 9 provide a current difference as high as 110 $\mu A/\mu m$. The availability 110 $\mu A/\mu m$ of signal for devices with 0.2 to 0.3 $\mu m$ width means that current differences of 22 to 33 $\mu A$ per device can be achieved. As 1 $\mu A$ is enough for detection, it can be seen that several levels of charge can be stored in a single transistor body.

Figure 10A:
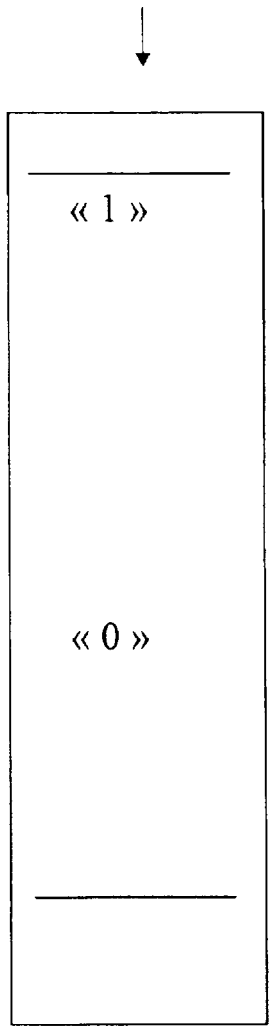
FIGS. 10 and 11 show multiple charging levels of the transistor of FIG. 1.
Figure 10B:
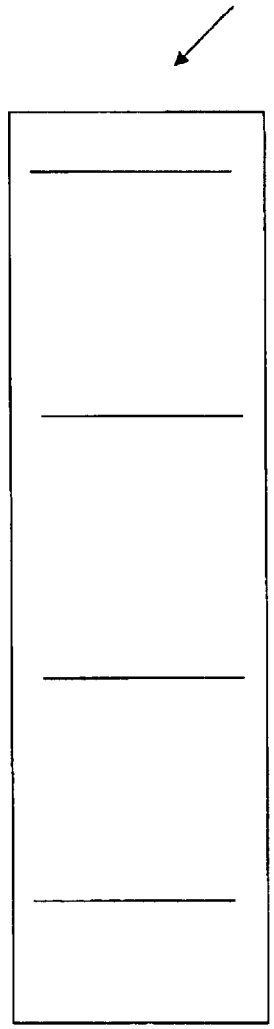
Figure 10C:
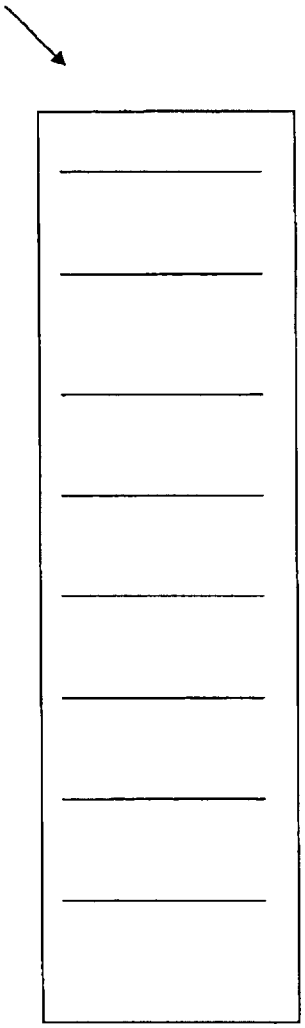

It is therefore possible to store multiple bits of data, for example, as shown in FIG. 10. FIG. 10a shows a simple arrangement in which two levels are available, and one bit of data can be stored. In FIGS. 10b and 10c, multiple bits of data can be stored in states between the maximum and minimum charging levels. For example, to be able to store two bits of data, a total current window of 3 $\mu A$ is required, while 7 $\mu A$ is required to store three bits per device. With a total window of 33 $\mu A$, five bits, corresponding to 32 levels, can be stored in the same transistor. It will be appreciated that by storing a data word consisting of several data bits, as opposed to a single data bit, the storage capacity of a semiconductor memory using this technique can be significantly increased.

Figure 11:
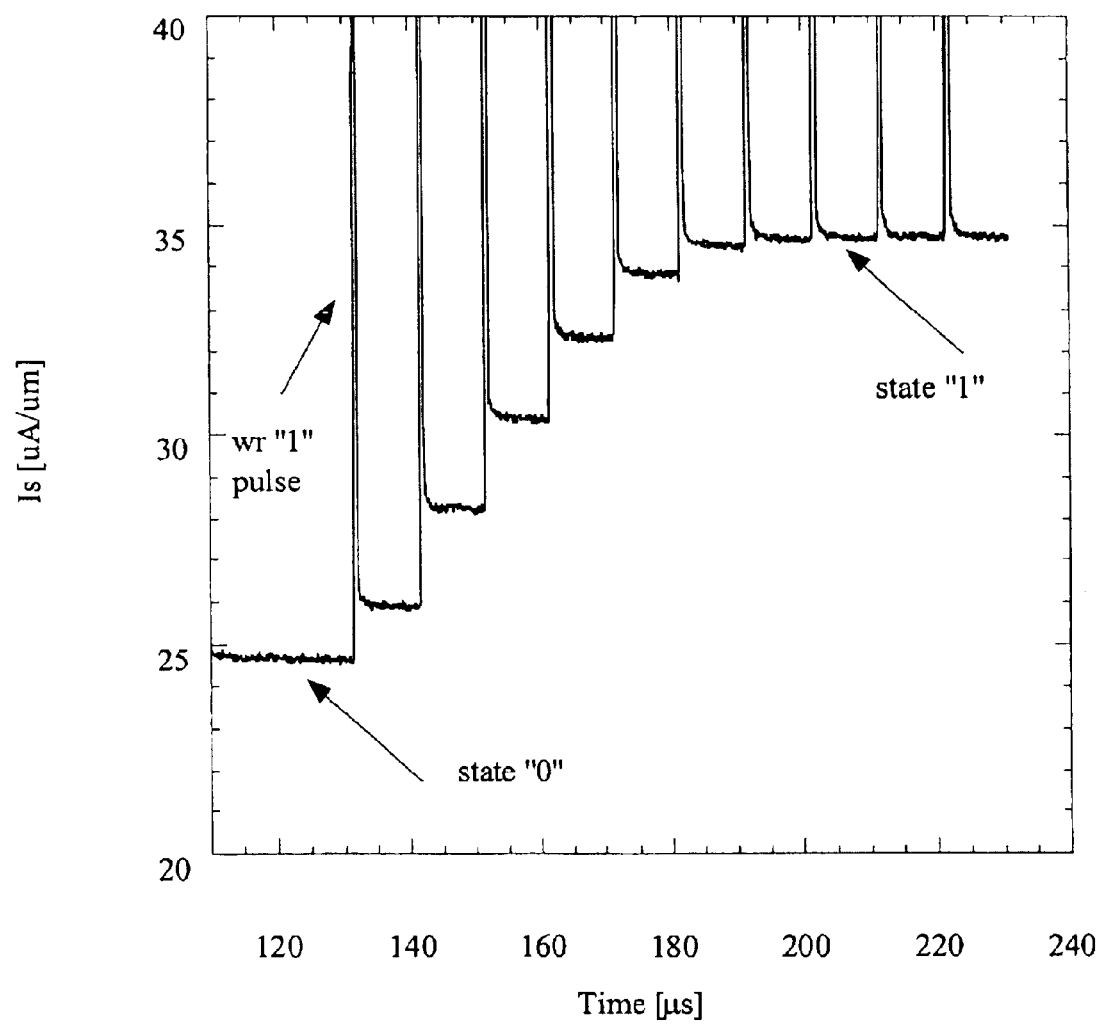

FIG. 11 shows the time dependence of a pulsed charging operation. Charging between different levels can be achieved by creating an initial "0" state, and then repeatedly writing "1" pulses, or by starting from the highest state, and repeatedly writing "0" pulses. One other possibility is to use different writing pulses to obtain different states, for example, by varying the writing pulse amplitude and duration to obtain a particular level.

Figure 12:
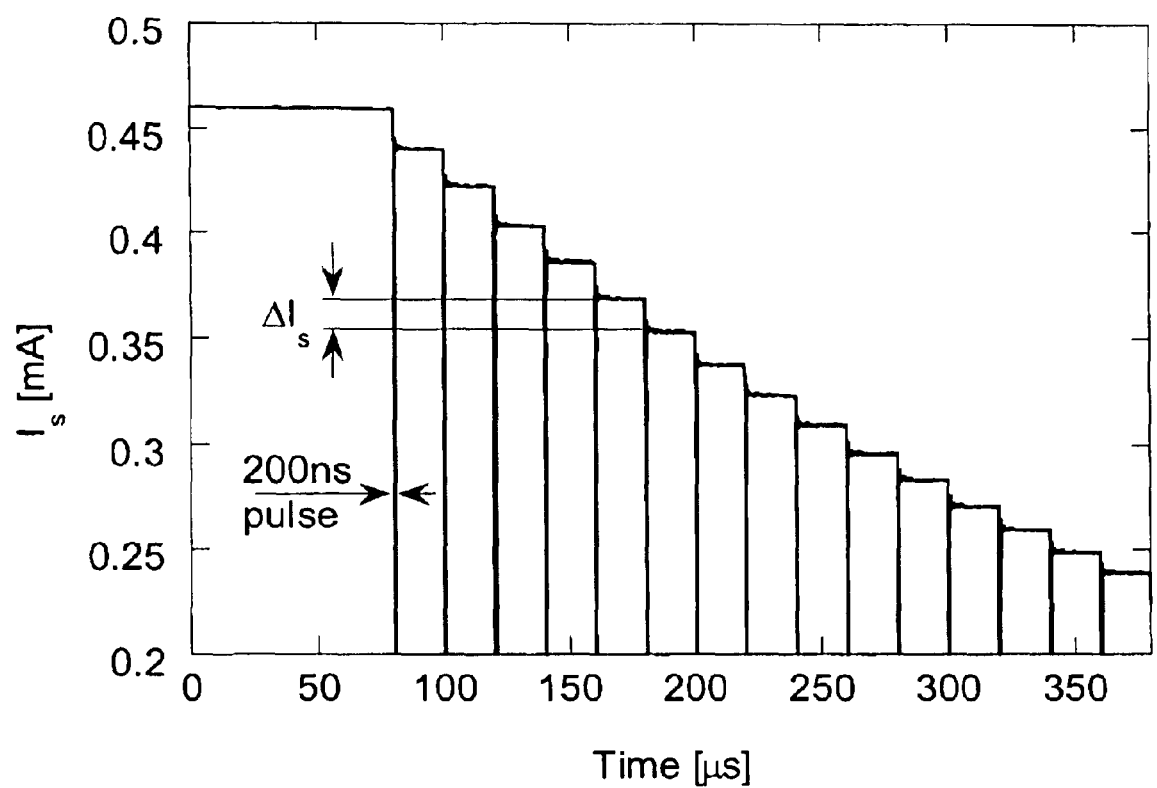
FIG. 12 shows multiple charging levels of the transistor of FIG. 1 achieved by means of the methods of FIGS. 6 and 7.

A further possibility is shown in FIG. 12, which shows the levels achievable using the charge pumping principle described with reference to FIGS. 6 and 7. The amount of charge removed after each pulse causes a current decrease of $\Delta I_s$, and the various levels can be obtained by changing the number of charge pumping pulses.

As pointed out above, the charge states of the body 20 of the transistor can be used to create a semiconductor memory device, data "high" states being represented by a positive charge in the body 20, and data "low" states being represented by a negative or zero charge. The data stored in the transistor can be read out from the memory device by comparing the source-drain current of the transistor with that of an uncharged reference transistor.

Figure 13:
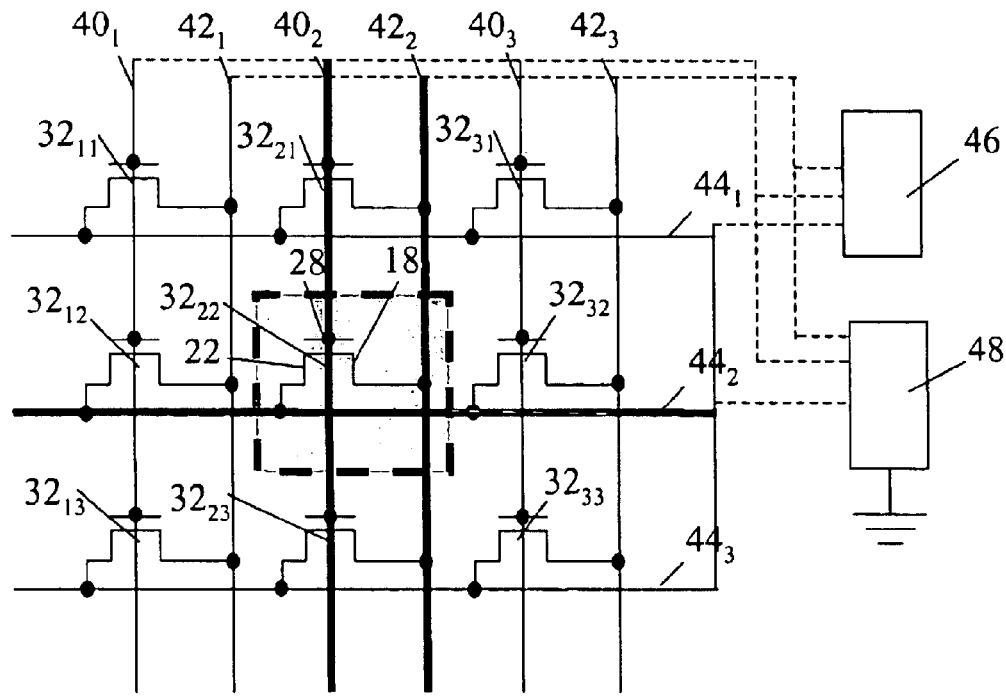
FIG. 13 is a schematic representation of part of a DRAM memory device embodying the present invention and incorporating the transistor FIGS. 1, 5, 6, 7, 8 or 9.

A DRAM (dynamic random access memory) device operating according to this principle is shown in FIG. 13. A DRAM device is formed from a matrix of data storage cells, each cell consisting of a field effect transistor of the type shown in FIGS. 1, 5, 6, 7, 8 or 9, the sources of the transistors of each row being connected together, and the gates and drains of the transistors of each column being connected together, a transistor $32_{ij}$ corresponding to a transistor located on column I and row j, the transistor $32_{22}$ being highlighted in FIG. 13. The gate 28, source 18 and drain 22 of transistor $32_{ij}$ are connected to conductive tracks 40i, 42i and 44j, respectively. The conductive tracks 40, 42 and 44 are connected to a control unit 46 and a reading unit 48, the construction and operation of which will be familiar to persons skilled in the art. The sources are earthed via the reading unit 48, or may be connected to a given fixed potential.

The operation of the memory device shown in FIG. 13 will now be described.

Initially, all gates (tracks 40) are at −2V, and all drains (tracks 44) and sources (tracks 42) are held at 0V. In order to write a data bit of state "1" to a transistor $32_{ij}$, all tracks 40 of columns different from i are still held at −2V, while track 40i is brought to −1.5V. During the time that the potential of track 40i is −1.5V, all tracks 44 of rows different from j are still held at 0V, while the potential of track 44j is brought to −2V. This process generates a positive charge in the body of transistor $32_{ij}$, as described above with reference to FIG. 2, the positive charge representing a single data bit of state "1". The potential of track 44j is then brought back to 0V, and the potential of track 40i is subsequently brought back to −2V.

In order to write a data bit of state "zero" to the transistor $32_{ij}$, from the condition in which all gates are initially held at −2V and all sources and drains are held at 0V, track 40i is brought to a voltage of +1V, the other tracks 40 being held at −2V. During the time that the potential of track 40i is +1V, all tracks 44 of rows other than j are held at 0V, while the potential of track 44j is brought to −2V. This generates a net negative charge in the body of the transistor and the potential of track 44j is then brought back to 0V. The potential of track 40i is then subsequently brought back to −2V.

In order to read the information out of the transistor $32_{ij}$, the voltage of tracks 40 of columns different from i is brought to 0V, while track 40i is held at 1V, and the voltage of tracks 44 of rows different from j is brought to 0V, while track 44j is held at +0.3V. As shown in FIG. 13, this then enables the current on track 44j, which is representative of the charge in the body of transistor $32_{ij}$, to be determined. However, by applying a drain voltage of 0.3V, this also provides the advantage that unlike conventional DRAM devices, the reading of data from transistor $32_{ij}$ does not discharge the transistor $32_{ij}$. In other words, because the step of reading data from the data storage cell does not destroy the data stored in the cell, the data does not need to be refreshed (i.e., rewritten to the transistor $32_{ij}$) as frequently as in the prior art.

However, it will be appreciated by persons skilled in the art that the electric charge stored in the body of transistor $32_{ij}$ decays with time as a result of the electric charges migrating and recombining with charges of opposite sign, the time dependence of which depends on a number of factors, including the temperature of the device, or the presence of radiation or particles such as photons striking the transistor. A further application of this will be described in more detail below.

Figure 14:
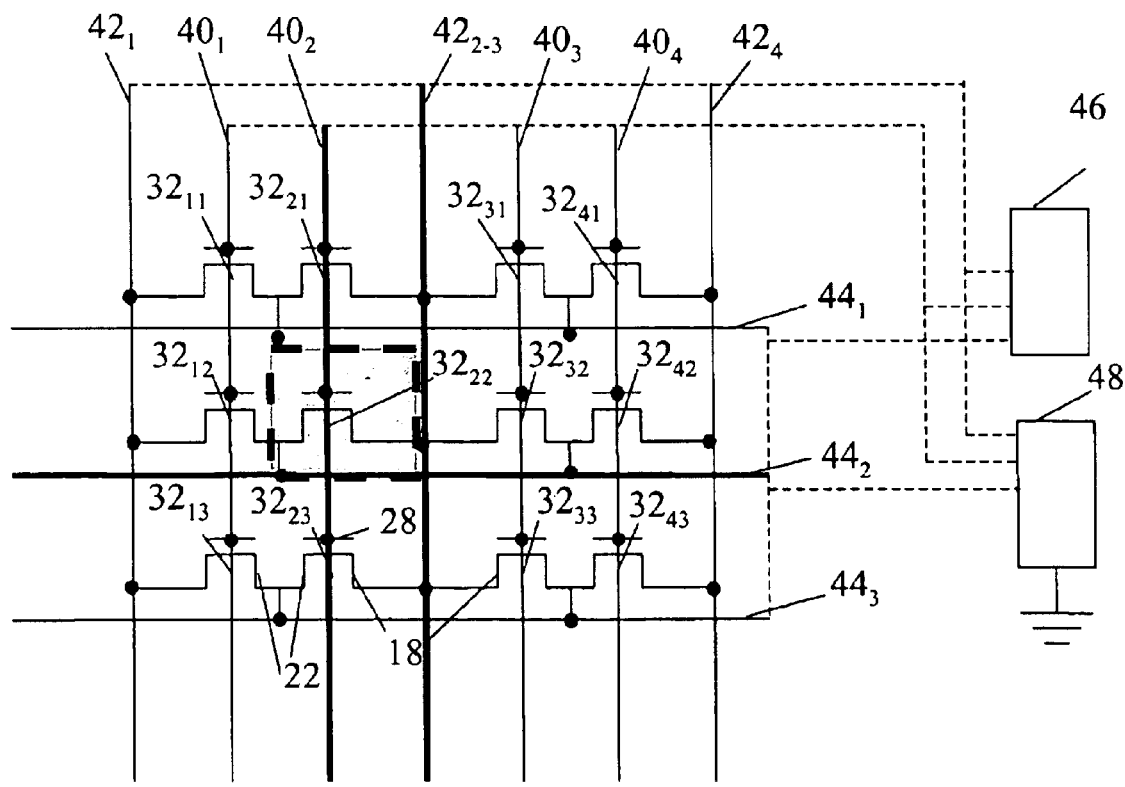
FIG. 14 is a schematic representation of part of a DRAM memory device of a further embodiment of the present invention and incorporating the transistor FIGS. 1, 5, 6, 7, 8 or 9.

In the memory unit described with reference to FIG. 13, each data storage cell is formed by a transistor 32 disposed in an insulating honeycomb structure 24. The source and drain of neighbouring transistors are located adjacent the drain and source of the two neighbouring transistors in the same row, respectively. A DRAM device of a second embodiment is shown in FIG. 14, in which parts common to the embodiment of FIG. 13 are denoted by like reference numerals. In the embodiment of FIG. 14, for each row of transistors, other than those arranged at the ends, each transistor shares its drain and source region with its neighbours. This enables the number of tracks 42 and connections on tracks 44 to be reduced almost by a factor of 2.

Figure 15:
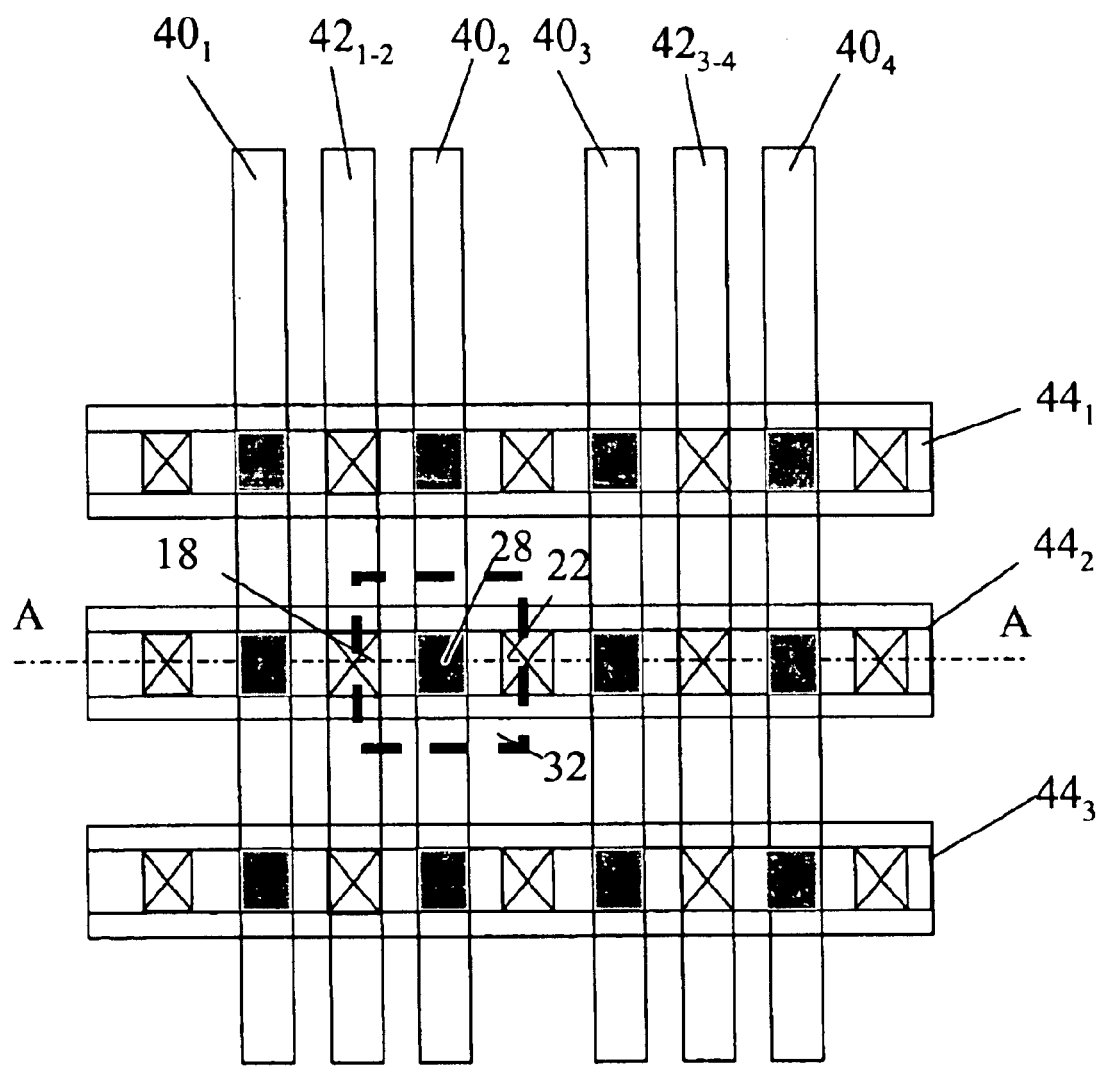
FIG. 15 is a plan view of the part of the DRAM memory device of FIG. 14.
Figure 16:
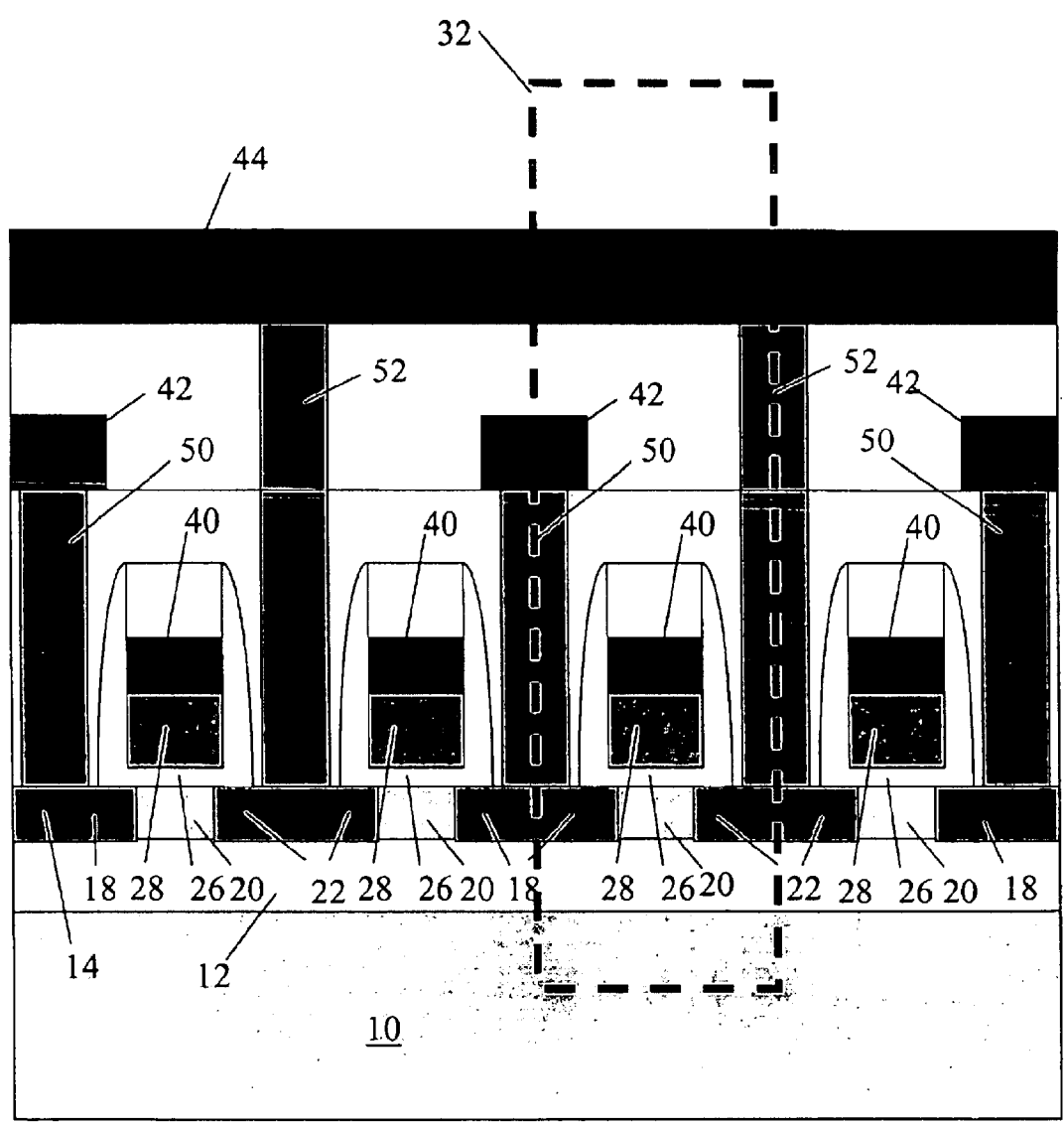
FIG. 16 is a cross-sectional view along the line A—A in FIG. 15.

A cross-sectional view of the DRAM device of FIGS. 14 and 15 is shown in FIG. 16, the view being taken along the line A—A in FIG. 15. The device comprises a substrate 13 including a silicon wafer 10 and insulating layer 12 as in FIG. 1, with sources 18, bodies 20 and drains 22 being formed on the insulating layer 12. Dielectric films 26 are provided on bodies 20, and are extended upwards to the side of gates 28. The gates are interconnected by tracks 40 and the sources 18 are interconnected via respective pillars 50 by tracks 42, the tracks 40, 42 extending parallel to each other in a direction perpendicular to the plane of the paper of FIG. 16. The drains 22 are interconnected via respective pillars 52 by tracks 44 extending in a direction perpendicular to tracks 40, 42, and of which only one is shown in FIG. 16.

As will be familiar to persons skilled in the art, in order to periodically refresh the data contained in the cells of the memory device, alternate reading and writing operations can be carried out, with part of the charge detected during reading being supplemented in the transistor in question. The refreshing frequency typically ranges from 1 ms to 1 second, a more detailed description of which is provided in ADRAM circuit design ISBNO-78036014-1.

Figure 17:
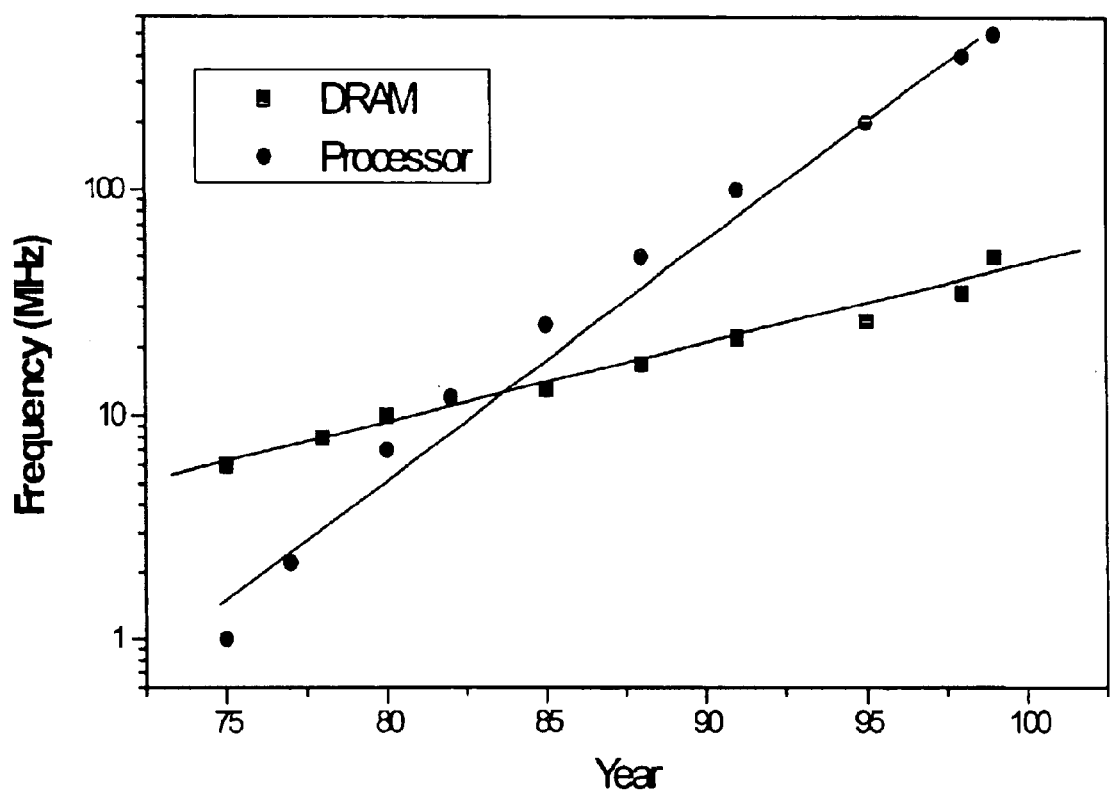
FIG. 17 shows the development of integrated circuit processor performance compared with DRAM performance.

As well as using charging of the body of a transistor as described above to construct a DRAM memory device, the charging process can be applied to other types of memory, such as SRAM (static random access memory). One particular application is to cache SRAM applications. In modem microprocessors (MPU), the DRAM/MPU performance gap illustrated in FIG. 17 has forced the MPU manufacturers to add some memory to the MPU. This memory is called cache memory. For example, the Intel 486 processor used 8 Kbytes of cache memory. This memory is used to store information that is needed frequently by the MPU. In modem Pentium processors, a second level of cache memory, up to 256 Kbytes, has been added to keep up performance. According to industry trends, next generation processors (the 10 Ghz Pentium processors for example) will require a third level of cache memory having a density of 8 to 32 Mbytes of cache.

This memory has previously been provided by a 6 transistor SRAM cell (6T). The cell occupies typically an area of 100 to 150 $F^2$, where F is the minimum feature size, which is quite large. Applying the charge storing concept set out above, a 1T (1 transistor) cell can replace the 6T transistor cell. Integrated in a logic technology, it can occupy a 10 to 15 $F^2$ area, which is 10 times less. This is of significant importance since integrating tens of Mbytes of 6T SRAM cells required die sizes much too large for practical fabrication.

Figure 18:
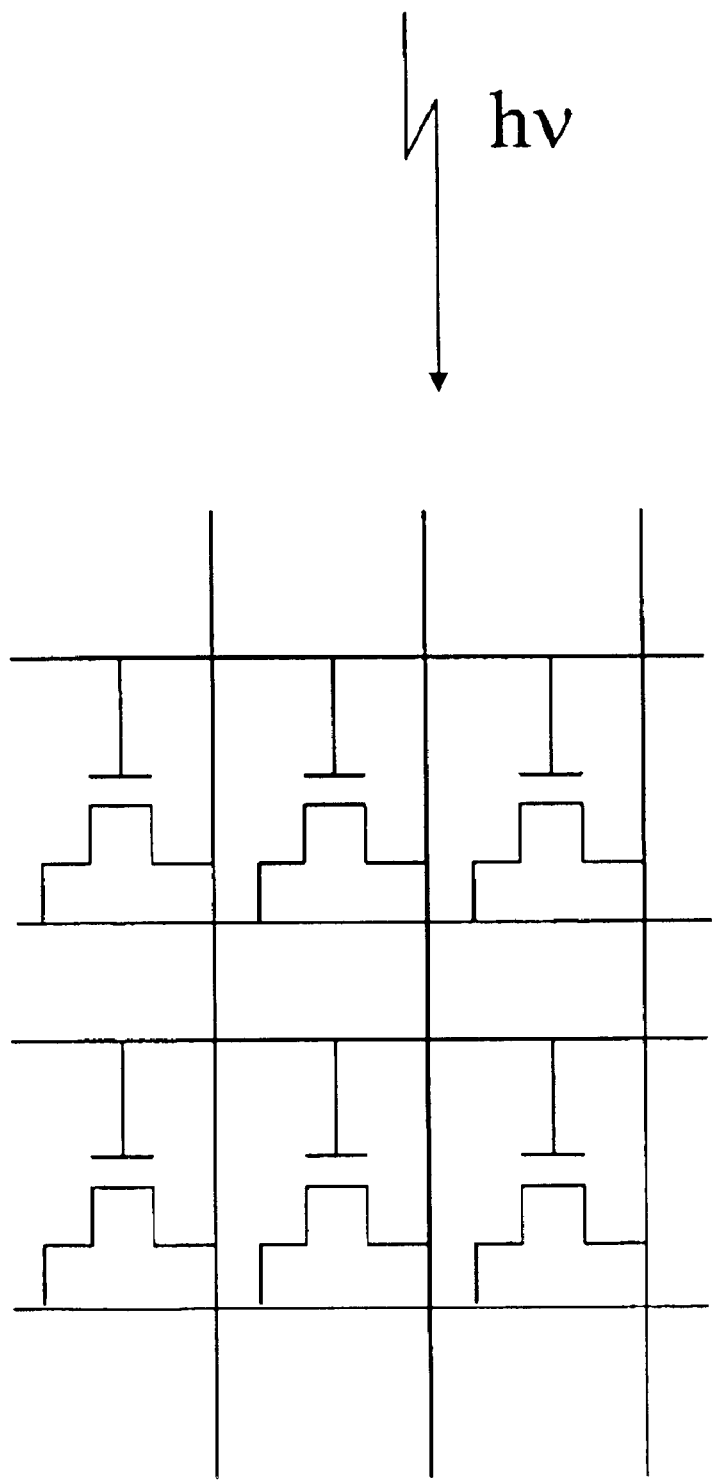
FIG. 18 is a schematic representation of an optical sensor embodying the present invention and incorporating the transistor of FIGS. 1, 5, 6, 7, 8 or 9.

As pointed out above, the charge stored on the body of a transistor can also represent some physical parameter to be measured, for example the incidence of optical radiation. FIG. 18 is a schematic representation of a CMOS image sensor embodying the present invention.

Image sensors have hitherto been made with a matrix of photosensitive devices, each of which is provided with a MOS transistor acting as a switch. To boost the information contained in each pixel, the pixel itself is also provided with an in-built amplifier. Such pixels are called active pixel sensors (APS) and typically include several devices: photo gate APS have typically 1 photosensitive capacitor and 4 transistors. Photodiode APS have typically 1 photosensitive diode and 3 or 4 transistors. In these APS devices the incoming light is incident on the circuit (sometimes through a lens) and hits the sensitive element of the device. An integration cycle then allows charge generated by the incoming optical radiation to be accumulated and to generate an electrical signal in a few ms or a few tens of ms, This signal is then amplified and read. The matrix organization is similar to a memory matrix organization, a typical pixel size being about 400 $F^2$, where F is the technology minimum feature size.

In the arrangement shown in FIG. 18, it is possible to create a full pixel with a single transistor that acts at the same time as light sensitive element and as an amplifier. To achieve this, SOI transistors are arranged in a matrix arrangement similar to that described for the DRAM applications above. The incoming light can come from the top or from the bottom (in this second case, an advantageous feature of SOI technology being that the silicon substrate below the buried oxide can be removed locally in the sensor matrix to provide an easy rear side illumination option).

To operate the sensor, a reset operation is required, the reset operation consisting of removing the majority carriers from the floating body (holes in the case of an NMOS transistor). For an NMOS device this means putting all devices in what is called a "0" state in the DRAM application. That this reset operation can be achieved by hole evacuation as described with reference to FIGS. 1 to 3, or more preferably by the charge pumping technique described with reference to FIGS. 6 and 7. When the reset has been carried out (in typically 1 $\mu$s), the light then creates electron hole pairs in the body of the device. The minority carriers are removed through the junction and the majority carriers accumulate in the body, allowing the charge integration. The information is read like in a DRAM memory, as explained above. The pixel area achievable with such devices can be as small as $4F^2$, or 100 times smaller than in prior art devices. These imagers can be used in various applications, such as portable video recorders, digital photography, web cams, PC cameras, mobile telephones, fingerprint identification, and so on.

It will be appreciated by persons skilled in the art that the above embodiments have been described by way of example only and not in any limitative sense, and that various alterations and modifications are possible without departure from the scope of the invention as defined by the appended claims. For example the process, described with reference to NMOS transistors, can also be applied to PMOS transistors, in which case the stored charge is negative, i.e., formed by electrons, and that the free particles in the channel are holes. In that case, the channel is produced by the application of a negative potential to the gate. Also, in certain types of SOI transistors, the substrate can also act as a gate. In that case, the insulating layer performs the function of the dielectric film and the channel is formed at the interface of the body and the insulating layer. In addition, the invention can be applied to JFET Ounction field effect transistor) technology as well as to the MOSFET technology described above. Furthermore, instead of providing a layer of insulating material on the silicon substrate, adjacent transistors can be electrically isolated from each other by means of a layer of n-type silicon on the silicon substrate, and biasing the n-type silicon layer such that the junction formed by the p-type transistor body and the n-type silicon is reverse biased. In such cases, the body region of each transistor should also extend below the corresponding source and drain regions to separate the source and drain regions from the n-type silicon layer, and adjacent transistors are isolated from each other by means of a silicon dioxide layer extending downwards as far as the n-type silicon layer.

What is claimed is:

1. A semiconductor memory array comprising:
a plurality of memory cells arranged in a matrix of rows and columns, the plurality of memory cells includes a first memory cell and a second memory cell, wherein the first and second memory cells each includes at least a transistor to constitute the memory cell and wherein the transistor includes:
a source region;
a drain region;
a body region disposed between and adjacent to the source region and the drain region, wherein the body region is an electrically floating state; and
a gate disposed over the body region;
wherein each memory cell includes:
a first data state representative of a first charge in the body region; and
a second data state representative of a second charge in the body region wherein the second charge is substantially provided by removing charge from the body region through the source region; and
wherein the gate of the transistor of the first memory cell and the gate of the transistor of the second memory cell are connected.

2. The memory array of claim 1 wherein:
the plurality of memory cells further includes a third memory cell and a fourth memory cell, wherein the third and fourth memory cells each includes at least a transistor to constitute the memory cell and wherein the transistor includes:
a source region;
a drain region;
a body region disposed between and adjacent to the source region and the drain region, wherein the body region is an electrically floating state; and
a gate disposed over the body region;
wherein each memory cell includes:
a first data state representative of a first charge in the body region; and
a second data state representative of a second charge in the body region wherein the second charge is substantially provided by removing charge from the body region through the source region; and
wherein the source region of the transistor of the first memory cell and the source region of the transistor of the third memory cell are the same region and wherein the drain region of the transistor of the first memory cell and the drain region of the transistor of the fourth memory cell are the same region.

3. The memory array of claim 1 wherein the first charge is comprised of an accumulation of majority carriers in the body region of the transistor of the first memory cell.

4. The memory array of claim 3 wherein the majority carriers accumulate in a portion of the body region that is adjacent to the source region of the transistor of each memory cell of the plurality of memory cells.

5. The memory array of claim 1 further including a control unit, coupled to the gate and the drain region of the first memory cell, to provide control signals to the first memory cell, wherein the first memory cell, in response to a first write control signals, stores the first charge in the body region of the transistor of the first memory cell.

6. The memory array of claim 1 further including a control unit, coupled to the gate and the drain region of the first memory cell, to provide control signals to the first memory cell, wherein the first memory cell, in response to a second write control signals, stores the second charge in the body region of the transistor of the first memory cell by removing charge from the body region of the transistor of the first memory cell through its source region.

7. The memory array of claim 6 wherein the control unit applies positive voltages to the drain region and gate of the transistor of the first memory cell to provide the second charge in the body region of the transistor of the first memory cell.

8. The memory array of claim 7 wherein the control unit is coupled to the gate, drain region and source region of the transistor of the second memory cell and applies positive voltages to the drain region and gate of the transistor of the first memory cell to provide the second charge in the body region of the transistor of the first memory cell and applies a first voltage to the drain and source regions of the transistor of the second memory cell to maintain the data state of the second memory cell.

9. The memory array of claim 8 wherein the first voltage is ground.

10. A semiconductor memory array comprising:
a plurality of memory cells arranged in a matrix of rows and columns, the plurality of memory cell includes a first memory cell and a second memory cell, wherein the first and second memory cells each includes at least a transistor to constitute the memory cell and wherein the transistor includes:
a source region having impurities to provide a first conductivity type;
a drain region having impurities to provide the first conductivity type,
a body region disposed between and adjacent to the source region and the drain region wherein the body region is electrically floating and includes impurities to provide a second conductivity type wherein the second conductivity type is different than the first conductivity type;
a gate disposed over the body region;
wherein the memory cell includes:
a first data state representative of a first charge in the body region wherein the first charge is substantially provided by impact ionization; and
a second data state representative of a second charge in the body region wherein the second charge is substantially provided by removing charge from the body region through the source region; and
wherein the gate of the transistor of the first memory cell and the gate of the transistor of the second memory cell are connected.

11. The memory array of claim 10 wherein:
the plurality of memory cells further includes a third memory cell wherein the third memory cell includes at least a transistor to constitute the memory cell wherein the transistor includes:
a source region having impurities to provide the first conductivity type;
a drain region having impurities to provide the first conductivity type,
a body region disposed between and adjacent to the source region and the drain region wherein the body region is electrically floating and includes impurities to provide the second conductivity type wherein the second conductivity type is different than the first conductivity type;
a gate disposed over the body region; and
wherein the memory cell includes:
a first data state representative of a first charge in the body region wherein the first charge is substantially provided by impact ionization; and
a second data state representative of a second charge in the body region wherein the second charge is substantially provided by removing charge from the body region through the source region; and
wherein the source region of the transistor of the first memory cell and the source region of the transistor of the third memory cell are the same region.

12. The memory array of claim 10 wherein:
the plurality of memory cells further includes a fourth memory cell wherein the fourth memory cell includes at least a transistor to constitute the memory cell wherein the transistor includes:
a source region having impurities to provide the first conductivity type;
a drain region having impurities to provide the first conductivity type,
a body region disposed between and adjacent to the source region and the drain region wherein the body region is electrically floating and includes impurities to provide the second conductivity type wherein the second conductivity type is different than the first conductivity type;
a gate disposed over the body region,
wherein the memory cell includes:
a first data state representative of a first charge in the body region wherein the first charge is substantially provided by impact ionization; and
a second data state representative of a second charge in the body region wherein the second charge is substantially provided by removing charge from the body region through the source region; and
wherein the drain region of the transistor of the first memory cell and the drain region of the transistor of the fourth memory cell are the same region.

13. The memory array of claim 12 wherein the first charge is comprised of an accumulation of majority carriers in the body region of the transistor of the first memory cell.

14. The memory array of claim 13 wherein the majority carriers accumulate in a portion of the body region that is adjacent to the source region of the transistor of each memory cell of the plurality of memory cells.

15. The memory array of claim 12 further including a control unit, coupled to the gate and the drain region of the transistor of the first memory cell, to provide control signals to the first memory cell, wherein the first memory cell, in response to a first write control signals, stores the first charge in the body region of the transistor of the first memory cell.

16. The memory array of claim 12 further including a control unit, coupled to the gate and the drain region of the transistor of the first memory cell, to provide control signals to the first memory cell, wherein the first memory cell, in response to second write control signals, stores the second charge in the body region of the transistor of the first memory cell by removing charge from the body region of the transistor of the first memory cell through its source region.

17. The memory array of claim 16 wherein the control unit applies positive voltages to the drain region and gate of the transistor of the first memory cell to provide the second charge in the body region of the transistor of the first memory cell.

18. The memory array of claim 17 wherein the control unit is coupled to the gate, drain region and source region of the transistor of the second memory cell and applies positive voltages to the drain region and gate of the transistor of the first memory cell to provide the second charge in the body region of the transistor of the first memory cell and applies a first voltage to the drain and source regions of the transistor of the second memory cell to maintain the data state of the second memory cell.

19. The memory array of claim 18 wherein the first voltage is ground.

20. A semiconductor memory array, disposed in or on a semiconductor layer which resides on or above an insulating layer of a substrate, the semiconductor memory array comprising:
a plurality of memory cells, including a first memory cell and a second memory cell, arranged in a matrix of rows and columns and disposed in or on the semiconductor layer, wherein the first and second memory cells each includes at least a transistor to constitute the memory cell and wherein the transistor includes:
a source region having impurities to provide a first conductivity type;
a drain region having impurities to provide the first conductivity type,
a body region disposed between and adjacent to the source region, the drain region and the insulating layer of the substrate, wherein the body region is electrically floating and includes impurities to provide a second conductivity type wherein the second conductivity type is different than the first conductivity type;
a gate spaced apart from, and capacitively coupled to, the body region;
wherein the memory cell includes:
a first data state representative of a first charge in the body; and
a second data state representative of a second charge in the body region wherein the second charge is substantially provided by removing charge from the body region through the source region; and
wherein the gate of the transistor of the first memory cell and the gate of the transistor of the second memory cell are connected.

21. The memory array of claim 20 wherein:
the plurality of memory cells further includes a third memory cell wherein the third memory cell includes at least a transistor to constitute the memory cell wherein the transistor includes:
a source region having impurities to provide the first conductivity type;
a drain region having impurities to provide the first conductivity type;
a body region disposed between and adjacent to the source region and the drain region wherein the body region is electrically floating and includes impurities to provide the second conductivity type wherein the second conductivity type is different than the first conductivity type;
a gate spaced apart from, and capacitively coupled to, the body region; and
wherein the memory cell includes:
a first data state representative of a first charge in the body; and
a second data state representative of a second charge in the body region wherein the second charge is substantially provided by removing charge from the body region through the source region; and
wherein the source region of the transistor of the first memory cell and the source region of the transistor of the third memory cell are the same region.

22. The memory array of claim 21 wherein:
the plurality of memory cells further includes a fourth memory cell wherein the fourth memory cell includes at least a transistor to constitute the memory cell wherein the transistor includes:
a source region having impurities to provide the first conductivity type;
a drain region having impurities to provide the first conductivity type;
a body region disposed between and adjacent to the source region and the drain region wherein the body region is electrically floating and includes impurities to provide the second conductivity type wherein the second conductivity type is different than the first conductivity type;
a gate spaced apart from, and capacitively coupled to, the body region; and
wherein the memory cell includes:
a first data state representative of a first charge in the body; and
a second data state representative of a second charge in the body region wherein the second charge is substantially provided by removing charge from the body region through the source region; and
wherein the drain region of the transistor of the first memory cell and the drain region of the transistor of the fourth memory cell are the same region.

23. The memory array of claim 20 wherein the second charge is provided in the body of the transistor of the first memory cell in response to a first positive voltage applied to the drain region of the transistor of the first memory cell.

24. The memory array of claim 23 wherein the second charge is stored in the body region of the transistor of the first memory cell in response to removing the first positive voltage from the drain region of the transistor of the first memory cell before removing a second positive voltage from the gate of the transistor of the first memory cell.

25. The memory array of claim 24 wherein, in response to the first and second positive voltages, the first memory cell includes a forward bias current between the body region and the source region of the transistor of the first memory cell.

26. The memory array of claim 25 wherein the second charge is stored in the body region of the transistor of the first memory cell in response to removing the first positive voltage from the drain region of the transistor of the first memory cell and wherein the source regions of the transistors of the first and second memory cells are connected to a fixed voltage.

27. The memory array of claim 20 wherein the first charge is comprised of an accumulation of majority carriers in the body region of the transistor of the first memory cell.

28. The memory array of claim 27 wherein the majority carriers accumulate in a portion of the body region that is adjacent to the source region of the transistor of each memory cell of the plurality of memory cells.

29. The memory array of claim 20 further including a control unit, coupled to the gate and the drain region of the transistor of the first memory cell, to provide control signals to the first memory cell, wherein the first memory cell, in response to a first write control signals, stores the first charge in the body region of the transistor of the first memory cell.

30. The memory array of claim 20 further including a control unit, coupled to the gate and the drain region of the transistor of the first memory cell, to provide control signals to the first memory cell, wherein the first memory cell, in response to second write control signals, stores the second charge in the body region of the transistor of the first memory by removing charge from the body region of the transistor of the first memory cell through its source region.

31. The memory array of claim 30 wherein the control unit applies positive voltages to the drain region and gate of the transistor of the first memory cell to provide the second charge in the body region of the transistor of the first memory cell.

32. The memory array of claim 31 wherein the control unit applies positive voltages to the drain region and gate of the transistor of the first memory cell to provide the second charge in the body region of the transistor of the first memory cell and applies a first voltage to the drain and source regions of the transistor of the second memory cell to maintain the data state of the second memory cell.

33. The memory array of claim 32 wherein the first voltage is ground.

* * * * *

UNITED STATES PATENT AND TRADEMARK OFFICE
CERTIFICATE OF CORRECTION

PATENT NO.   : 6,873,539 B1  
DATED        : March 29, 2005  
INVENTOR(S)  : Fazan et al.

Page 1 of 1

It is certified that error appears in the above-identified patent and that said Letters Patent is hereby corrected as shown below:

<u>Column 14,</u>
Lines 26 and 48, insert -- in -- after "is" and before "an".

Signed and Sealed this

Fifth Day of July, 2005

JON W. DUDAS
*Director of the United States Patent and Trademark Office*